(12) United States Patent
Nakagawa et al.

(10) Patent No.: US 7,184,338 B2
(45) Date of Patent: Feb. 27, 2007

(54) SEMICONDUCTOR DEVICE, SEMICONDUCTOR DEVICE TESTING METHOD, AND PROGRAMMING METHOD

(75) Inventors: Harunobu Nakagawa, Kanagawa (JP); Minoru Aoki, Tokyo (JP); Shigekazu Yamada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/215,253

(22) Filed: Aug. 30, 2005

(65) Prior Publication Data

US 2006/0077736 A1  Apr. 13, 2006

Related U.S. Application Data

(63) Continuation of application No. PCT/JP04/12475, filed on Aug. 30, 2004.

(51) Int. Cl.
G11C 7/00 (2006.01)
G11C 29/00 (2006.01)

(52) U.S. Cl. .................. 365/201; 365/189.03
(58) Field of Classification Search ............... 365/201, 365/189.03
See application file for complete search history.

(56) References Cited

U.S. PATENT DOCUMENTS

| | | | | |
|---|---|---|---|---|
| 5,257,225 A * | 10/1993 | Lee | | 365/185.19 |
| 5,555,204 A | 9/1996 | Endoh et al. | | 365/189 |
| 5,682,346 A | 10/1997 | Yamamura et al. | | 365/185 |
| 5,751,637 A * | 5/1998 | Chen et al. | | 365/185.33 |
| 5,754,475 A * | 5/1998 | Bill et al. | | 365/185.25 |
| 5,784,315 A * | 7/1998 | Itoh | | 365/185.22 |
| 5,801,989 A | 9/1998 | Lee et al. | | 365/185 |
| 5,943,260 A | 8/1999 | Hirakawa | | 365/185 |
| 5,991,201 A * | 11/1999 | Kuo et al. | | 365/185.19 |
| 6,016,274 A * | 1/2000 | Itoh | | 365/185.29 |
| 6,091,640 A * | 7/2000 | Kawahara et al. | | 365/185.28 |
| 6,243,290 B1* | 6/2001 | Kurata et al. | | 365/185.03 |
| 6,643,180 B2* | 11/2003 | Ikehashi et al. | | 365/185.22 |
| 2002/0071313 A1 | 6/2002 | Takano et al. | | 365/185 |
| 2003/0137876 A1 | 7/2003 | Hirano | | 365/185 |
| 2005/0226055 A1* | 10/2005 | Guterman | | 365/185.28 |

FOREIGN PATENT DOCUMENTS

| | | |
|---|---|---|
| JP | 6-131879 | 5/1994 |
| JP | 7-169284 | 7/1995 |
| JP | 8-329694 | 12/1996 |

(Continued)

OTHER PUBLICATIONS

K.D. Suh et al., "A 3.3V 32Mb. NAND Flash Memory with Incremental Step Pulse Programming Scheme", ISSCC Digest of Technical Papers, pp. 128-129, Feb. 1995.

Primary Examiner—Anh Phung
Assistant Examiner—Allison Bernstein

(57) ABSTRACT

A semiconductor device includes: a latch circuit that latches a given signal in a test mode; and a generating circuit that generates a signal that defines a program voltage used for programming of a memory cell in accordance with the signal latched in the latch circuit. The generating circuit includes: a circuit that generates the signal that defines an initial voltage of the program voltage; a circuit that generates the signal that defines a pulse width of the program voltage; and a circuit that generates the signal that defines a step width of the program voltage when the program voltage is a voltage that increases stepwise.

33 Claims, 22 Drawing Sheets

FOREIGN PATENT DOCUMENTS

| | | |
|---|---|---|
| JP | 10-241380 | 2/1997 |
| JP | 9-180841 | 7/1997 |
| JP | 11-134879 | 5/1999 |
| JP | 11-283399 | 10/1999 |
| JP | 2002-197880 | 12/2000 |
| JP | 2003-223791 | 1/2002 |
| JP | 2002-184190 | 6/2002 |
| JP | 2004-94987 | 3/2004 |

* cited by examiner

WHERE LADD IS FORMED WITH 2 BITS

WHERE LADD IS FORMED WITH 3 BITS

202 HIGH-VOLTAGE CONVERTING CIRCUIT

1211 SHIFT REGISTER

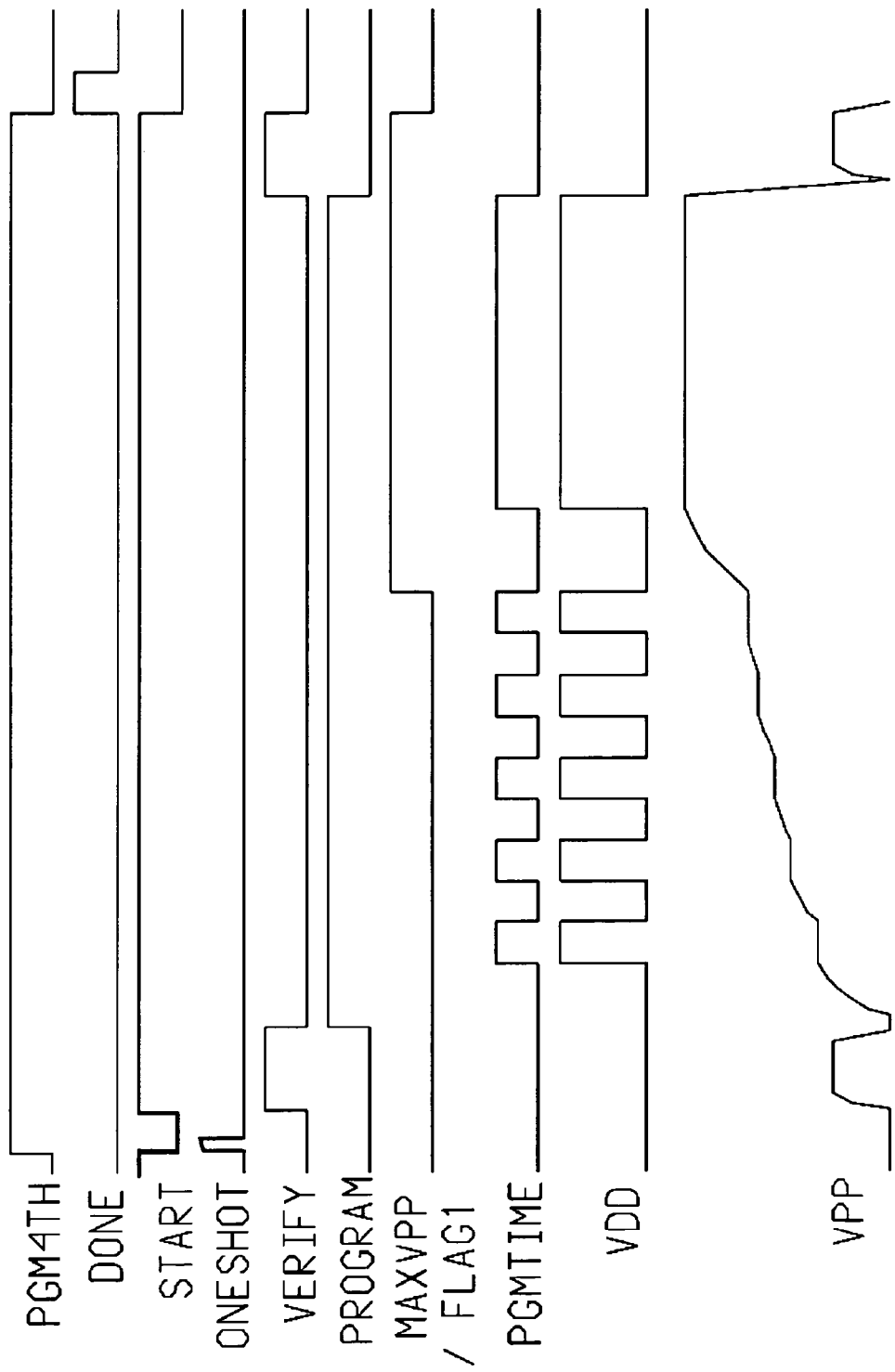

SEMICONDUCTOR DEVICE, SEMICONDUCTOR DEVICE TESTING METHOD, AND PROGRAMMING METHOD

CROSS REFERENCE TO RELATED APPLICATIONS

This is a continuation of International Application No. PCT/JP2004/012475, filed Aug. 30, 2004.

BACKGROUND OF THE INVENTION

1. Field of the Invention

The present invention relates to a semiconductor device, a testing method, and a programming method.

2. Description of the Related Art

Semiconductor memories are generally classified into volatile memories from which information is erased when the power source is switched off, and non-volatile memories in which information is maintained even when the power source is switched off. As a representative type among the non-volatile memories, flash memories having the rewrite time shortened by collectively erase data are known. Examples of flash memories that are not affected by variations in device characteristics are described in the following.

The device that is disclosed in Japanese Unexamined Patent Publication No. 2002-197880 determines the optimum programming conditions such as program widths in an operation test mode, and stores the information in the chip. In a regular operating mode, a control circuit accesses the information, and causes the device to operate under the programming conditions unique to the chip. The device that is disclosed in Japanese Unexamined Patent Publication No. 2003-223791 sets a voltage increase width for each chip for the time of step programming by a programming unit.

In recent years, flash memories with multilevel memory cells have been developed. FIG. 1 illustrates the threshold value distribution in multilevel memory cells. In FIG. 1, the abscissa axis indicates the threshold value, and the ordinate axis indicates the number of bits. In a device with multilevel memories, there are four memory cell levels of level 1, level 2, level 3, and level 4, and these four levels form two sets of output (or input) data. When programming is performed at level 4, a programming method by which level 4 is reached via level 1, level 2, and level 3 is generally employed.

With such multilevel memory cells, however, in a case where the threshold value Vth is in the range of 0v to 8v, the distribution of one value needs to be contained in within 1v, so as to obtain four values. So as to maintain the distribution in such a narrow region, highly precise programming operations are required. To perform highly precise programming operation, the optimum programming conditions need to be determined.

The device disclosed in Japanese Unexamined Patent Publication No. 2002-197880 determines the optimum programming conditions such as program width in an operation test mode. However, the document does not specifically disclose how the optimum programming conditions such as program widths are actually determined.

The device disclosed in Japanese Unexamined Patent Publication No. 2003-223791 sets a voltage increase width for each chip during a step programming operation. However, the document does not specifically disclose how the optimum voltage increase width is determined.

SUMMARY OF THE INVENTION

It is therefore an object of the present invention to provide a semiconductor device, a testing method, and a programming method in which the above problems are eliminated.

A more specific object of the present invention is to provide a semiconductor device that can determined the optimum conditions for program voltages, a testing method, and a programming method.

The above problems are eliminated by a semiconductor device that includes: a latch circuit that latches a given signal in a test mode; and a generating circuit that generates a signal that defines a program voltage used for programming of a memory cell in accordance with the signal latched in the latch circuit. In accordance with the present invention, a program voltage used for programming of a memory cell is internally generated in a test mode, using a given signal that is input from the outside. By doing so, the optimum conditions for a program voltage can be readily determined. In a regular operation, the optimum program voltage is used to perform precise programming operation.

The above generating circuit may generate the signal that defines an initial voltage of the program voltage. In accordance with the present invention, the signal that defines the initial voltage of the program voltage, is internally generated in a test mode, using a given signal that is input from the outside. By doing so, the optimum conditions for the initial voltage of the program voltage can be readily determined. In a regular operation, the initial voltage of the program voltage is used to perform precise programming operation.

The generating circuit may generate the signal that defines a pulse width of the program voltage. In accordance with the present invention, the signal that defines a pulse width of the program voltage is internally generated in a test mode, using a given signal that is input from the outside. By doing so, the optimum conditions for the pulse width of the program voltage can be determined. In a regular operation, the program voltage with the optimum pulse width is used to perform precise programming operation.

The generating circuit may generate the signal that defines a step width of the program voltage when the program voltage is a voltage that increases stepwise. In accordance with the present invention, the signal that defines a step width of the program voltage is internally generated in a test mode, using a given signal that is input from the outside. By doing so, the optimum conditions for the step width of the program voltage can be determined. In a regular operation, the program voltage with the optimum step width is used to perform precise programming operation.

The generating circuit may generate the signal that defines a step width of the program voltage when the program voltage is a voltage that increases stepwise, and the semiconductor device may further includes a voltage control circuit that controls a switch that selects a capacitor in accordance with the signal that defines the step width of the program voltage. In accordance with the present invention, a program voltage with the optimum step width can be generated.

The latch circuit may be connected to a given address terminal, and the given signal may be an address signal applied via the address terminal. In accordance with the present invention, an address signal that is input from the outside in a test mode, a program voltage can be internally generated.

The semiconductor device may further includes a sense amplifier circuit that outputs verification data from cell data read out from the memory cell during a given period for verification in the test mode. In accordance with the present invention, the programming state of a memory cell is externally judged in the test mode, so that the optimum conditions for the program voltage can be determined. In a regular operation, using the optimum program voltage, a precise programming operation can be realized.

The semiconductor device may further include a reference circuit that selects a specific reference cell from a plurality of reference cells used for verification in accordance with the given signal latched in the latch circuit.

The latch circuit may latch the given signal in accordance with a type of the signal that defines the program voltage. In accordance with the present invention, the number of signals to be latched is changed to increase the number of variations of program voltages.

The semiconductor device may further include a non-volatile memory (Content Addressable Memory: CAM) that stores the given signal latched in the latch circuit. In accordance with the present invention, the signal latched in the latch circuit is stored in a non-volatile memory, so that the signal that defines the program voltage can be generated based on the signal stored in the non-volatile memory after shipment. Thus, in a regular operation, a precise programming operation can be realized using the optimum program voltage.

The semiconductor device may further include: a non-volatile memory that stores the given signal latched in the latch circuit; and a control circuit that generates the signal that defines the program voltage in accordance with the given signal stored in the non-volatile memory. In accordance with the present invention, the signal latched in the latch circuit is stored in a non-volatile memory, so that the signal that defines the program voltage can be generated based on the signal stored in the non-volatile memory after shipment. Thus, in a regular operation, a precise programming operation can be realized using the optimum program voltage.

The memory cell may have multiple threshold values. In accordance with the present invention, a valid programming operation can be efficiently realized with a multilevel flash memory, without overprogramming.

The program voltage may increase stepwise for each of multiple threshold values of the memory cell. In accordance with the present invention, even when programming is performed by a ramp gate programming method, a valid programming operation can be efficiently realized without overprogramming.

The present invention also provides a method of testing a semiconductor device, including the steps of: latching a given signal in a test mode; and generating a signal that defines a program voltage used for programming of a memory cell in accordance with the given signal latched. In accordance with the present invention, using an address signal that is input from the outside in a test mode, a program voltage to be used for programming a memory cell can be internally generated, so that the optimum conditions for the program voltage can be readily determined. In a regular operation, using the optimum program voltage, a precise programming operation can be realized.

The step of generating may include the step of generating the signal that defines an initial voltage of the program voltage. In accordance with the present invention, using the given signal that is input from the outside in a test mode, the signal that defines the initial voltage of the program voltage can be internally generated, so that the optimum conditions for the initial voltage of the program voltage can be readily determined. In a regular operation, using the optimum initial voltage of the program voltage, a precise programming operation can be realized.

The step of generating may include the step of generating the signal that defines a pulse width of the program voltage. In accordance with the present invention, using the given signal that is input from the outside in a test mode, the signal that defines the pulse width of the program voltage can be internally generated, so that the optimum conditions for the pulse width of the program voltage can be determined. In a regular operation, using the program voltage with the optimum pulse width, a precise programming operation can be realized.

The step of generating may include the step of generating the signal that defines a step width of the program voltage. In accordance with the present invention, using the given signal that is input from the outside in a test mode, the signal that defines the step width of the program voltage can be internally generated, so that the optimum conditions for the step width of the program voltage can be determined. In a regular operation, using the program voltage with the optimum step width, a precise programming operation can be realized.

The present invention also provides a semiconductor device that includes: a write circuit that writes data having multiple levels into memory cells with multiple threshold values; and a generating circuit that generates, for each of the multiple levels, a signal that defines a program voltage that increases stepwise. In accordance with the present invention, the signal that defines the program voltage to be used by a ramp gate program method is generated for each level, so that the optimum conditions for the program voltage in the programming operation at each level are set. Thus, the programming time can be shortened.

The above generating circuit may include a circuit that generates, for each of the multiple levels, the signal that defines a step width of the program voltage. In accordance with the present invention, the program voltage with the optimum step width is set for each level, so that the programming time can be shortened.

The generating circuit may include a circuit that generates, for each of the multiple levels, the signal that defines a pulse width of the program voltage.

The generating circuit may include a circuit that generates, when programming is involved in a last one of the multiple levels, the signal that defines the program voltage having a pulse width greater than pulse widths of program voltages used for the multiple levels other than the last one. In accordance with the present invention, when programming is to be performed at the last level among several levels, a programming operation is performed using the program voltage with a greater pulse width than those of program voltages used at other levels. Thus, while overprogramming is prevented at the other levels, the programming time can be shortened at the last level.

The semiconductor device may further include a detection circuit that detects a situation in which the program voltage reaches a given voltage. In this semiconductor device, the generating circuit may include a circuit that generates, when programming is involved in a last one of the multiple levels, the signal that defines the program voltage having a pulse width greater than pulse widths of program voltages used for the multiple levels other than the last one after the detection circuit detects the situation. In accordance with the present invention, a programming operation is performed at the last level by increasing the program voltage stepwise until the program voltage reaches a predetermined level, and after the program voltage exceeds the predetermined level, a programming operation is performed using a program voltage with a greater pulse width than the pulse widths of program voltages used at the other levels. Thus, the programming time can be shortened at the last level.

The above generating circuit may include: a latch circuit that latches the program voltage in a given timing when programming is involved in a first level among the multiple levels; and a circuit that generates another signal that defines a second level following the first level on the basis of an initial program voltage corresponding to the program voltage latched in the latch circuit. In accordance with the present invention, the signal that defines the program voltage of the next level can be generated, with the program voltage of the previous level being taken into consideration. Thus, a programming operation suitable for the device characteristics can be realized, and the programming time can be shortened.

The given timing is defined as the timing in which verification for programming involved in the first level passes.

The generating circuit may be a control circuit that controls the write circuit. In accordance with the present invention, the signal that defines the program voltage that increases stepwise can be generated for each level inside the control circuit.

The present invention provides a semiconductor device that includes: a write circuit that writes data having multiple levels into a memory cell with multiple threshold values; and a control circuit that controls the write circuit and performs programming involved in a last one of the multiple levels with a program voltage having a pulse width greater than pulse widths used in programming involved in the multiple levels other than the last one. In accordance with the present invention, when programming is to be performed at the last level among several levels, a programming operation is performed using a program voltage with a greater pulse width than those of program voltages used at the other levels. Thus, the time required for the programming operation at the last level can be greatly shortened, while overprogramming is prevented.

The present invention also provides a semiconductor device that includes: a write circuit that writes data having multiple levels into memory cells with multiple threshold values; and a control circuit that controls the write circuit and performs programming so that a program voltage increases stepwise without verification until the program voltage reaches a given voltage when the programming is involved in a last one of the multiple levels. In accordance with the present invention, when programming is to be performed at the last level among several levels, a programming operation is performed while the program voltage is increased stepwise without verification until the program voltages reaches the predetermined voltage value. Thus, the time required for the programming operation at the last level can be greatly shortened.

The semiconductor device may further include a detection circuit that detects a situation in which the program voltage reaches a given voltage. In this semiconductor device, the control circuit performs programming so that the program voltage increases stepwise until the program voltage reaches the given voltage and performs programming involved in the last one of the multiple levels so that a program voltage is provided having a pulse width greater than pulse widths used in programming involved in the multiple levels other than the last one. In accordance with the present invention, a programming operation is performed while the program voltage is increased stepwise until the program voltages reaches the predetermined voltage value. After the program voltage reaches the predetermined voltage value, a programming operation is performed using a program voltage with a greater pulse width than program voltages used at the other levels. Thus, the time required for the programming operation at the last level can be greatly shortened.

The present invention also provides a semiconductor device that includes: a write circuit that writes data having multiple levels into memory cells with multiple threshold values; and a control circuit that controls the write circuit and performs programming involved in a first level out of the multiple levels so that a program voltage increases stepwise while storing the program voltage in a given timing, and performs programming involved in a second level out of the multiple levels so that an initial voltage corresponding to the program voltage stored increases stepwise. In accordance with the present invention, a programming operation of the next level is performed, with the program voltage of the previous level being taken into consideration. Thus, unnecessary programming is prevented, and the programming time can be shortened.

The semiconductor device may further include a latch circuit that latches the program voltage in the given timing.

The given timing may be defined as the timing in which verification for programming involved in the first level passes.

The semiconductor device may be a semiconductor memory device such as a flash memory.

The present invention also provides a programming method that includes the steps of: performing programming involved in a first one of multiple levels of data that is written into a memory cell with multiple threshold values while increasing a program voltage stepwise; storing the program voltage at a given timing in the step of performing; and performing programming involved in a second one of the multiple levels following the first one while increasing, stepwise, an initial program voltage corresponding to the program voltage stored in the step of storing. In accordance with the present invention, a second programming operation is performed while the initial program voltage corresponding to the program voltage stored for the programming at the second level following the first level is increased stepwise. Thus, the programming time can be shortened.

The present invention also provides a programming method that includes the steps of: performing programming involved in multiple levels except a last level while increasing a program voltage stepwise; and performing programming involved in the last level by using the program voltage having a pulse width greater than pulse widths of the program voltages used in programming involved in the multiple levels except the last level.

In accordance with the present invention, when programming is to be performed at multiple levels of a multilevel memory cell other than the last level, a programming operation is performed while the program voltage is increased stepwise. By doing so, overprogramming is prevented at the level other than the last level, and programming is performed using a program voltage with a greater pulse width at the last level. Thus, the programming time can be greatly shortened. By employing such a two-stage programming method, simultaneous programming in several memory cells can be performed. As a result, the programming time can be shortened.

The present invention also provides a programming method that includes the steps of: performing programming involved in multiple levels except a last level while increasing a program voltage stepwise; and performing programming involved in the last level while increasing the program voltage stepwise without verification for the programming until the program voltage reaches a given voltage. In accordance with the present invention, when programming is to be performed at the last level among several levels, a programming operation is performed while the program voltage is increased stepwise without verification until the program voltage reaches the predetermined voltage value. Thus, the time required for the programming operation at the last level can be greatly reduced.

In accordance with the present invention, a semiconductor device that can determine the optimum conditions for program voltages, a testing method, and a programming method can be provided.

BRIEF DESCRIPTION OF THE DRAWINGS

Other objects, features and advantages of the present invention will become more apparent from the following detailed description when read in conjunction with the accompanying drawings, in which:

FIG. 22 is a timing chart of PGM4TH in the ramp gate program.

DESCRIPTION OF THE PREFERRED EMBODIMENTS

The following is a description of embodiments of the present invention, with reference to the accompanying drawings.

First Embodiment

Figure 1:
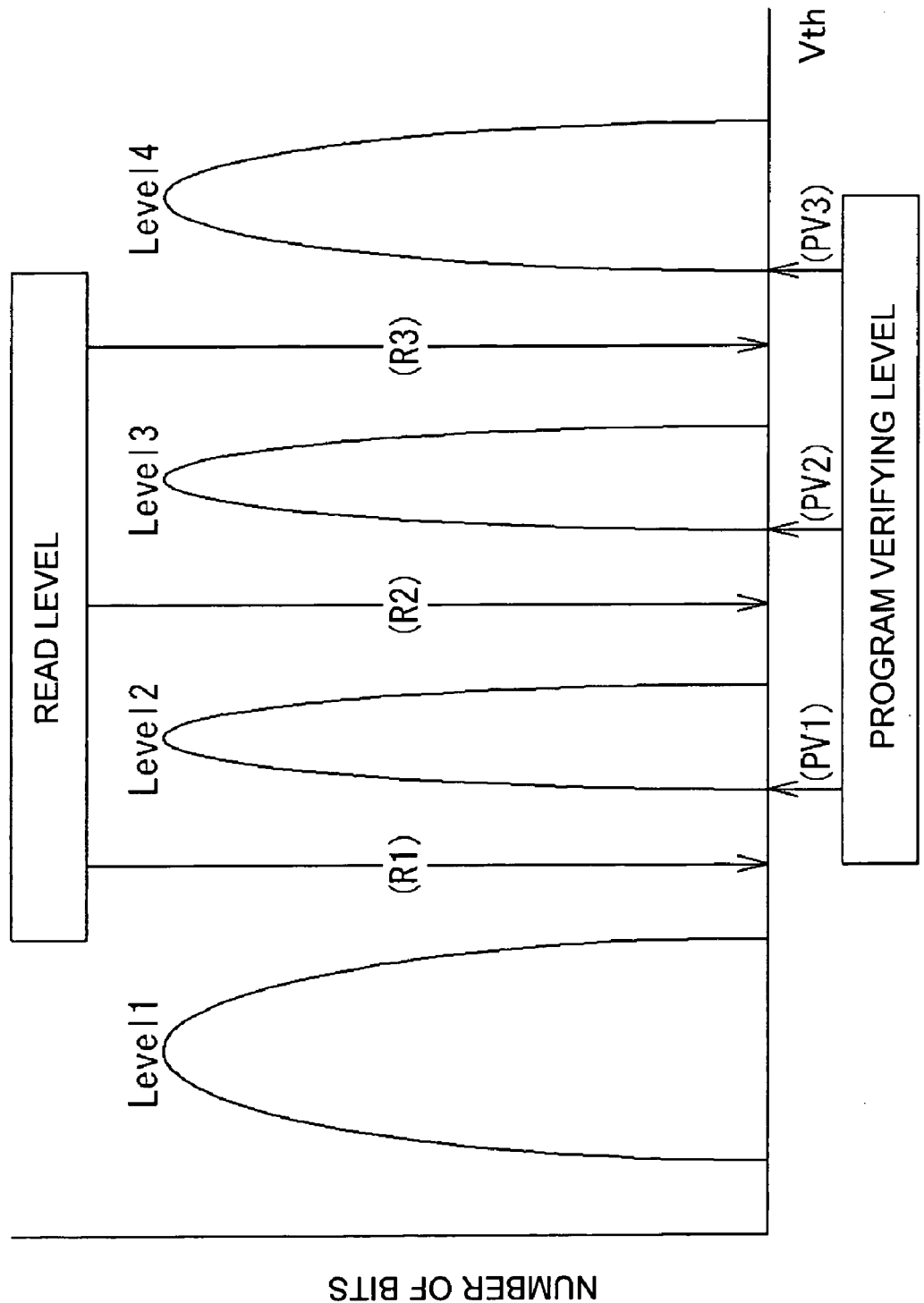
FIG. 1 shows the threshold value distribution in conventional multilevel memory cells.
Figure 2:
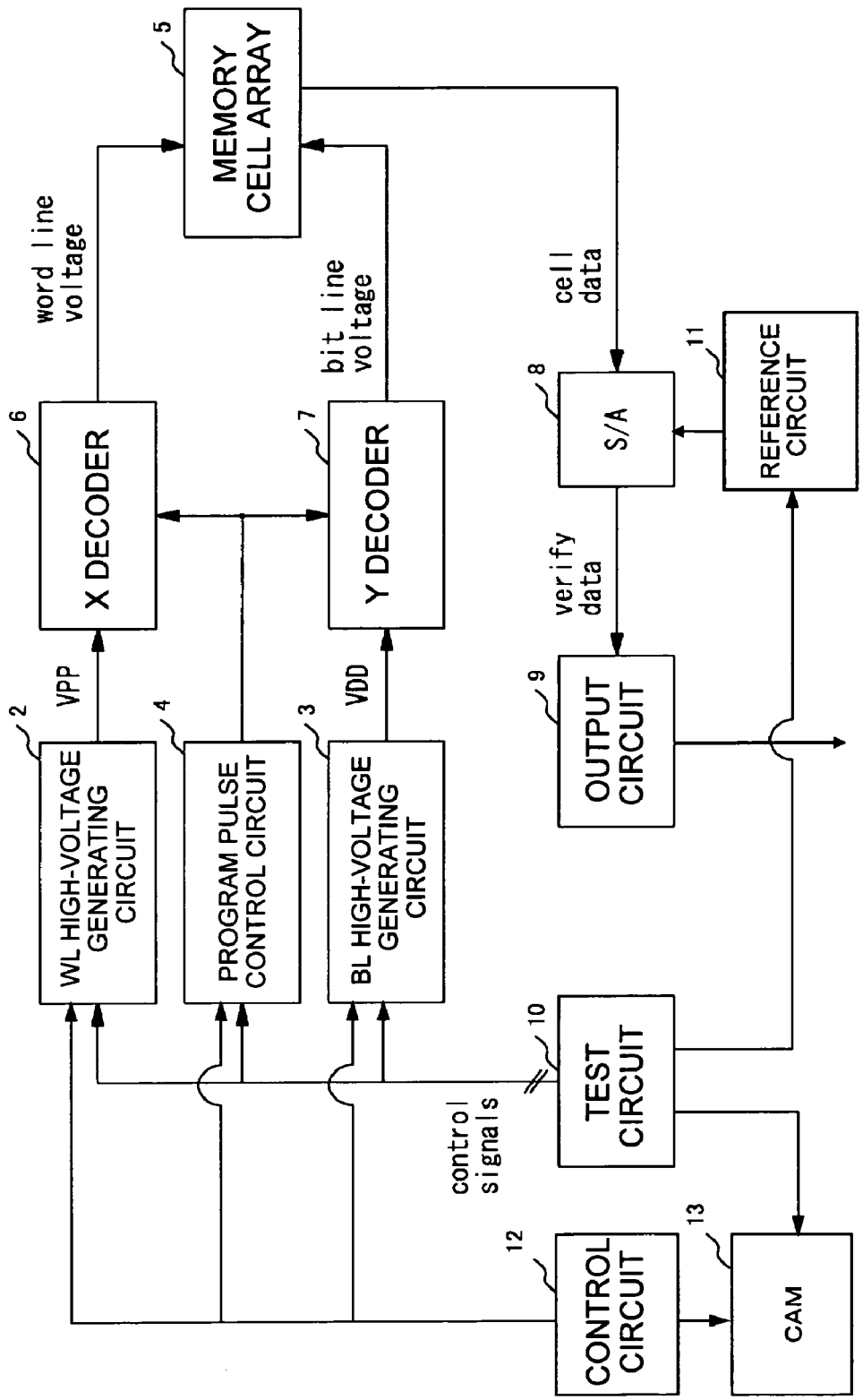
FIG. 2 is a block diagram of a semiconductor device in accordance with a first embodiment of the present invention.

A first embodiment is now described. FIG. 2 is a block diagram of a semiconductor device 1 in accordance with the first embodiment. As shown in FIG. 2, the semiconductor device 1 includes a WL high-voltage generating circuit 2, a BL high-voltage generating circuit 3, a program pulse controller 4, a memory cell array 5, an X decoder, a Y decoder 7, a sense amplifier circuit 8, an output circuit 9, a test circuit 10, a reference circuit 11, a control circuit 12, and a CAM 13. The semiconductor device 1 may be a semiconductor memory device such as a flash memory that is packaged independently, or may be incorporated into a semiconductor device such as a system LSI.

The WL high-voltage generating circuit 2 in a test mode receives a control signal from the test circuit 10, and generates and supplies a booster voltage VPP to the X decoder 6. The X decoder 6 applies a word line voltage. The BL high-voltage generating circuit 3 in the test mode receives a control signal from the test circuit 10, and generates and supplies a booster voltage VDD to the Y decoder 7. The Y decoder 7 applies a bit line voltage. The program pulse controller 4 in the test mode receives a control signal from the test circuit 10, and controls the voltage applied to the X decoder 6 and the Y decoder 7.

The memory cell array 5 includes a memory cell transistor array with different threshold values, word lines, and bit lines, and stores data in each memory cell transistor. When data is read out, the data from the memory cell designated through an activated word line is read into the corresponding bit line. When programming or erasing is performed, the word line and the bit line are set to a potential suitable for each operation, so that a charge injection into or charge removal from the memory cell is performed.

The test circuit 10 carries out each test in the test mode. The test circuit 10 includes a latch circuit 30 shown in FIG. 4 that latches an address signal that is input from the outside, and generating circuits 40 and 50 shown in FIGS. 6A and 6B that generate signals that define program voltages to be used at the time of programming in the memory cells. With this structure, various program voltages can be internally generated, using an address signal.

Using the signal latched in the latch circuit 30, the reference circuit 11 selects a reference cell to be used for verifying operation from a group of reference cells. The sense amplifier circuit 8 in the test mode compares the current of the cell data read out from the memory cell array 5 in accordance with the designation by the X decoder 6 and the Y decoder 7 with a reference current supplied form the reference circuit 11, thereby determining whether the data is 0 or 1 during a program verifying period. The sense amplifier circuit 8 sends the determination result as verification data to the output circuit 9. The output circuit 9 outputs the verification data from the sense amplifier circuit 8 to the outside.

As described above, in the test mode, a Pass/Fail determining operation is not performed inside the chip, but verification data is output to the outside so that an external tester can determine the result. Through the external tester, the optimum conditions for program voltages can be found.

The CAM 13 stores the information as to the optimum program voltage latched in the latch circuit 30. The control circuit 12 in a normal mode after shipment generates a signal that defines a program voltage, based on the information stored in the CAM 13. Thus, a programming operation can be performed using the optimum program voltage.

Figure 3:
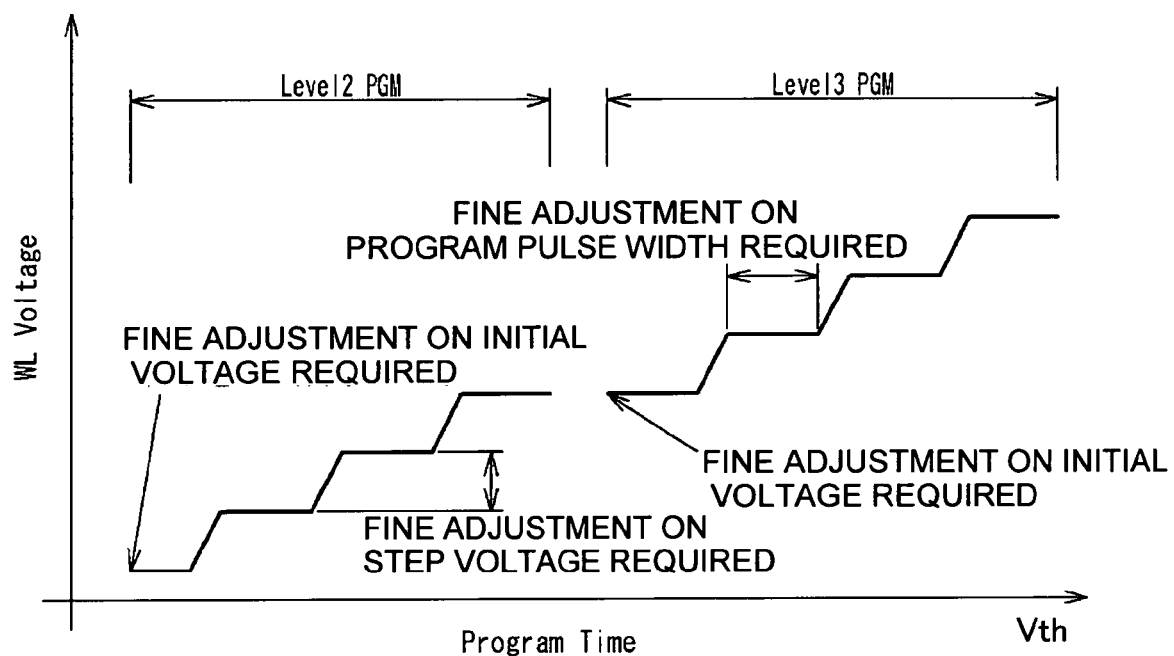
FIG. 3 illustrates a programming operation in accordance with a ramp gate programming method.

FIG. 3 illustrates a programming operation according to a ramp gate programming method. In FIG. 3, the abscissa axis indicates the program time, while the ordinate axis indicates the word line voltage. In a case where an initial voltage is applied to a gate so as to perform programming from level 1 (an erased state) to level 2, but the programming fails, the next programming is performed by boosting the gate voltage based on a step voltage. The method of performing programming by repeating the series of procedures is called "ramp gate programming method". A program voltage used in the ramp gate programming method increases stepwise at each level of memory cells with different threshold values.

Here, the essential factors are the initial voltage, the step voltage, and the program pulse width. In a case where the initial voltage is too high, and a cell in which programming can be performed very quickly exists, programming might be performed beyond the distribution region of level 2, resulting in overprogramming. In a case where the initial voltage is too low, the programming is slowed, and the program time becomes longer accordingly.

Likewise, in a case where the step voltage is too high, programming might becomes quicker. However if a cell in which programming can be performed in a very short time, overprogramming might be caused. In a case where the step voltage is too low, programming becomes slow. In a case where the pulse width is too great, programming tends to be deep, resulting in overprogramming. If the pulse width is too small, programming becomes insufficient, and the program time becomes longer. In view of the above facts, very precise programming is required. Therefore, a programming method for efficiently determining the above conditions needs to be employed.

So as to easily determine the optimum programming conditions, the test circuit 10 latches several address signals when entering the test mode, and arbitrarily selects each condition, using the latched addresses. By determining the conditions externally, the optimum conditions for a program voltage can be set. In a normal operation mode, programming is performed with the optimum program voltage, so that programming with high precision can be realized.

Figure 4:
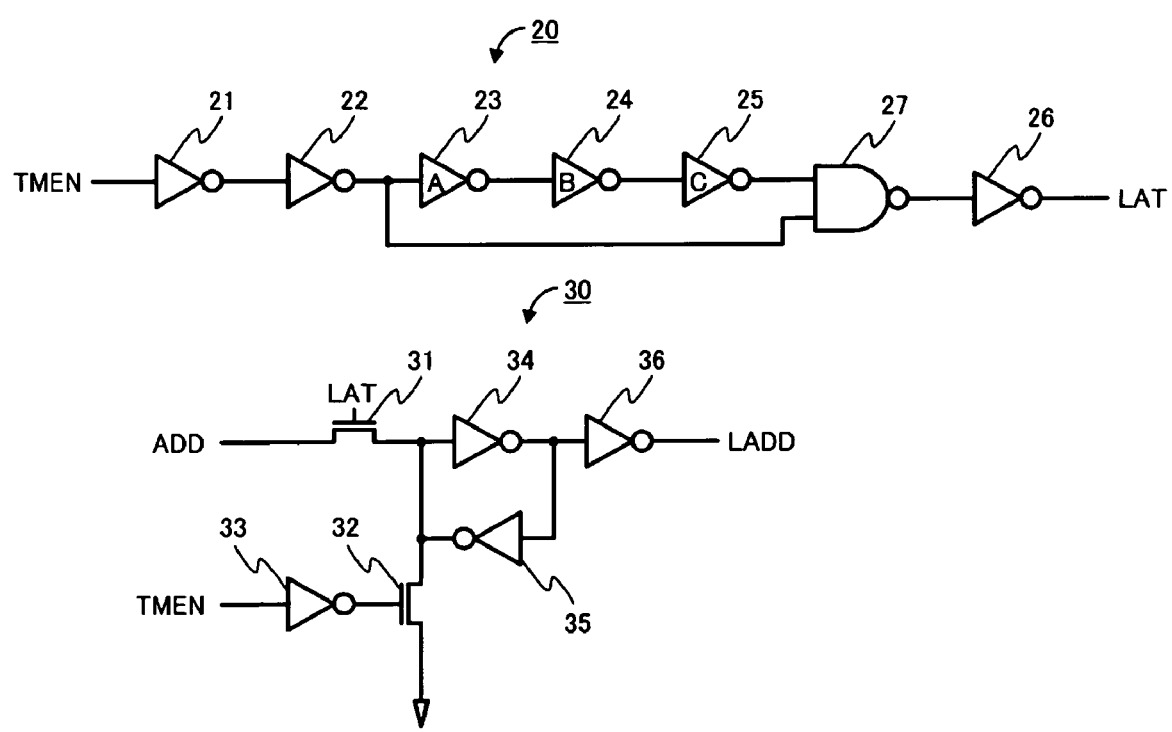
FIG. 4 illustrates a LAT generating circuit and a latch circuit that are provided in the test circuit.

FIG. 4 illustrates a LAT generating circuit 20 provided in the test circuit 10, and the latch circuit 30. As shown in FIG. 4, the LAT generating circuit 20 includes inverters 21 through 26, and a NAND circuit 27. The LAT generating circuit 20 generates a latch signal LAT from a signal TMEN. The latch circuit 30 in the test mode latches the address signal that is input from the outside. The latch circuit 30 includes NMOS transistors 31 and 32, and inverters 33 through 36. The latch circuit 30 is connected to an address terminal through which the address signal is input. The latch circuit 30 is prepared in the same number as the number of addresses, and is designed to latch a signal that is input from the output in accordance with the type of the signal that defines a program voltage. Therefore, the number of signals to be latched is changed to increase the number of variations of program voltages.

Figure 5:
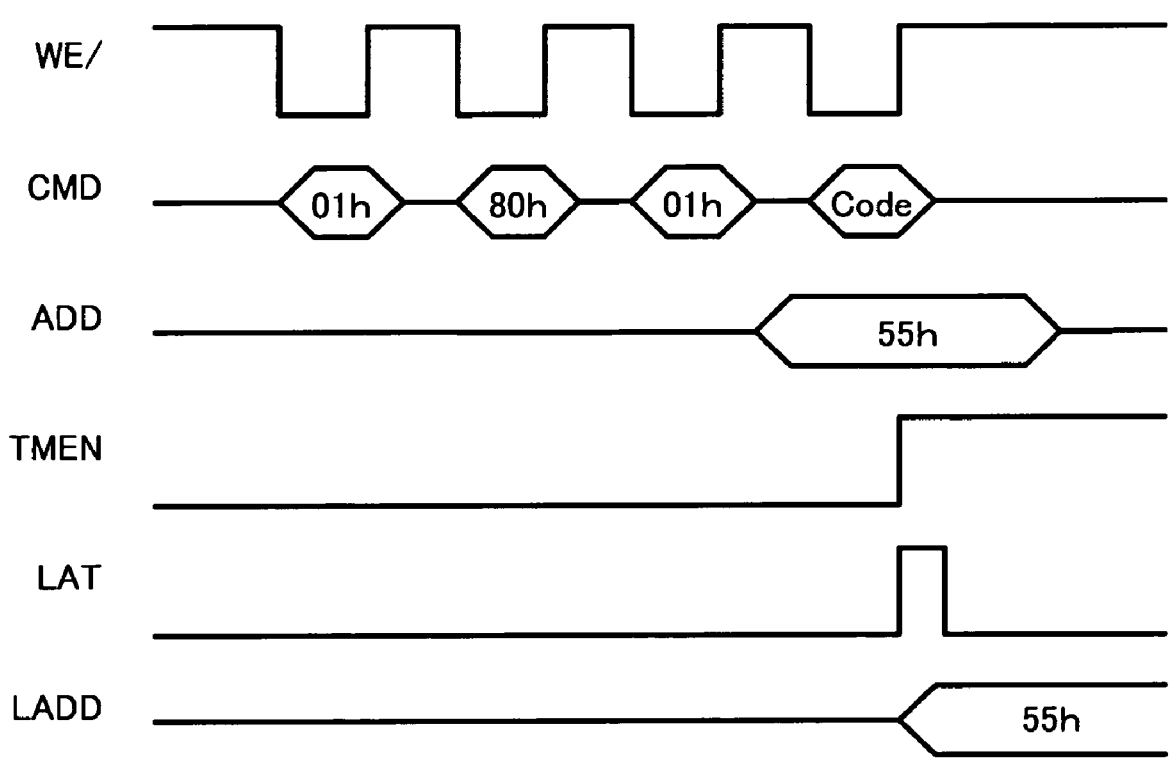
FIG. 5 is a timing chart of the operation for generating address latch signals in accordance with the first embodiment.

FIG. 5 is a timing chart in the operation of generating an address latch signal in accordance with the first embodiment. When the operation enters the test mode, a write enable signal (WE/) pulses as shown in FIG. 5. A command signal (CMD) is synchronized with the pulse of the signal WE/, so that a code for entering the test mode is written for each mode. Thus, the operation enters the test mode. For example, if the operation can enter the test mode through four cycles, several address signals are input when codes are issued during the last (fourth) cycle.

In response to the rise of the signal WE/ during the fourth cycle, the signal TMEN that indicates the entry into the test mode becomes High. Receiving the delays of the inverters 23 through 25, the latch signal LAT is generated as a pulse signal. In other words, the latch signal LAT pulses once. As the latch signal LAT pulses once, an address signal ADD is input to the latch unit formed with the inverters 34 and 35 via the transistor 31. An address latch signal LADD is then determined.

The address latch signal LADD is input to the generating circuits described later, so that fine adjustment can be performed on the initial voltage, the step voltage, and the program pulse width. When the operation exits from the test mode, the signal TMEN becomes Low, and the latch unit formed with the inverters 34 and 35 is reset.

Figure 6A:
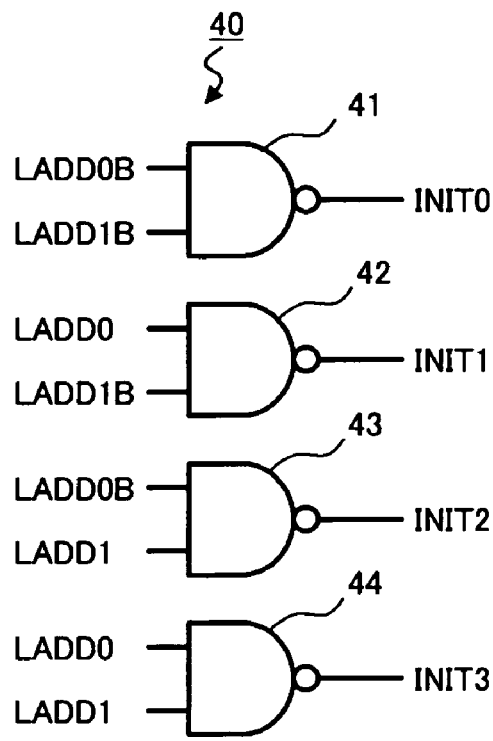
FIGS. 6A and 6B who the generating circuits that generate signals that define program voltages.
Figure 6B:
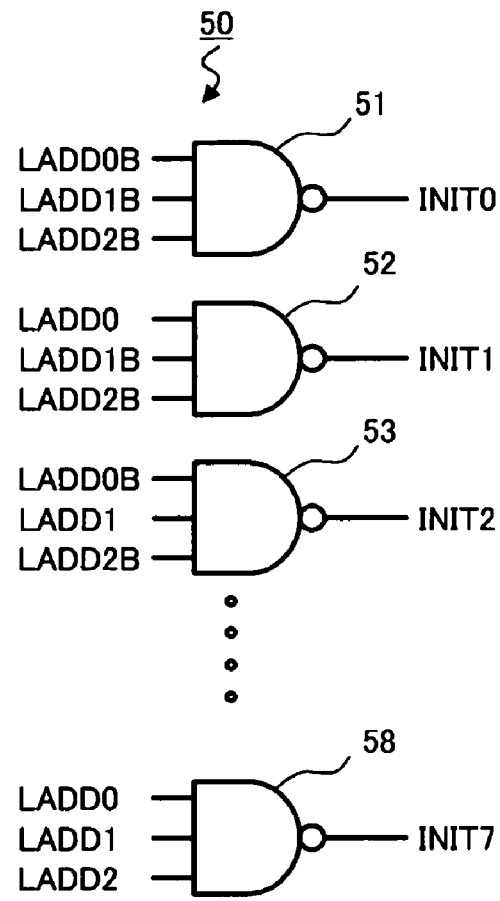

FIGS. 6A and 6B illustrate the generating circuits (decoding circuits) 40 and 50 that generate signals defining program voltages. FIG. 6A shows the generating circuit 40 used in a case where the address latch signal LADD is formed with 2 bits. FIG. 6B shows the generating circuit 50 used in a case where the address latch signal LADD is formed with three bits. The generating circuits 40 and 50 generate signals that define the initial voltages of program voltages, the program pulse widths, and the step widths of the program voltages.

As shown in FIG. 6A, the generating circuit 40 includes NAND circuits 41 through 44, and generates decoding signals INIT(3:0) from address latch signals LADD0, LADD1, LADD0B, and LADD1B that are supplied from the latch circuit 30. The signals LADD0B and LADD1B are obtained by inverting the address latch signals LADD0 and LADD1 supplied from the latch circuit 30. In a case where the address latch signal LADD is formed with two bits, four decoding signals INIT(3:0) can be generated by combining positive logic signals and negative logic signals, using a 2-input NAND or NOR. For example, four-level initial voltages can be generated using the signals INIT(3:0).

As shown in FIG. 6B, the generating circuit 50 includes NAND circuits 51 through 58, and generates decoding signals INIT(7:0) from address latch signals LADD0, LADD1, LADD2, LADD0B, LADD1B, and LADD2B that are supplied from the latch circuit 30. The signals LADD0B, LADD1B, and LADD2B are obtained by inverting the address latch signals LADD0, LADD1, and LADD2 supplied from the latch circuit 30. In a case where the address latch signal LADD is formed with three bits, eight decoding signals INIT(7:0) can be generated using a 3-input NAND or NOR. Based on the decoding signals INIT(7:0), fine adjustment can be performed on the initial voltage.

Figure 7:
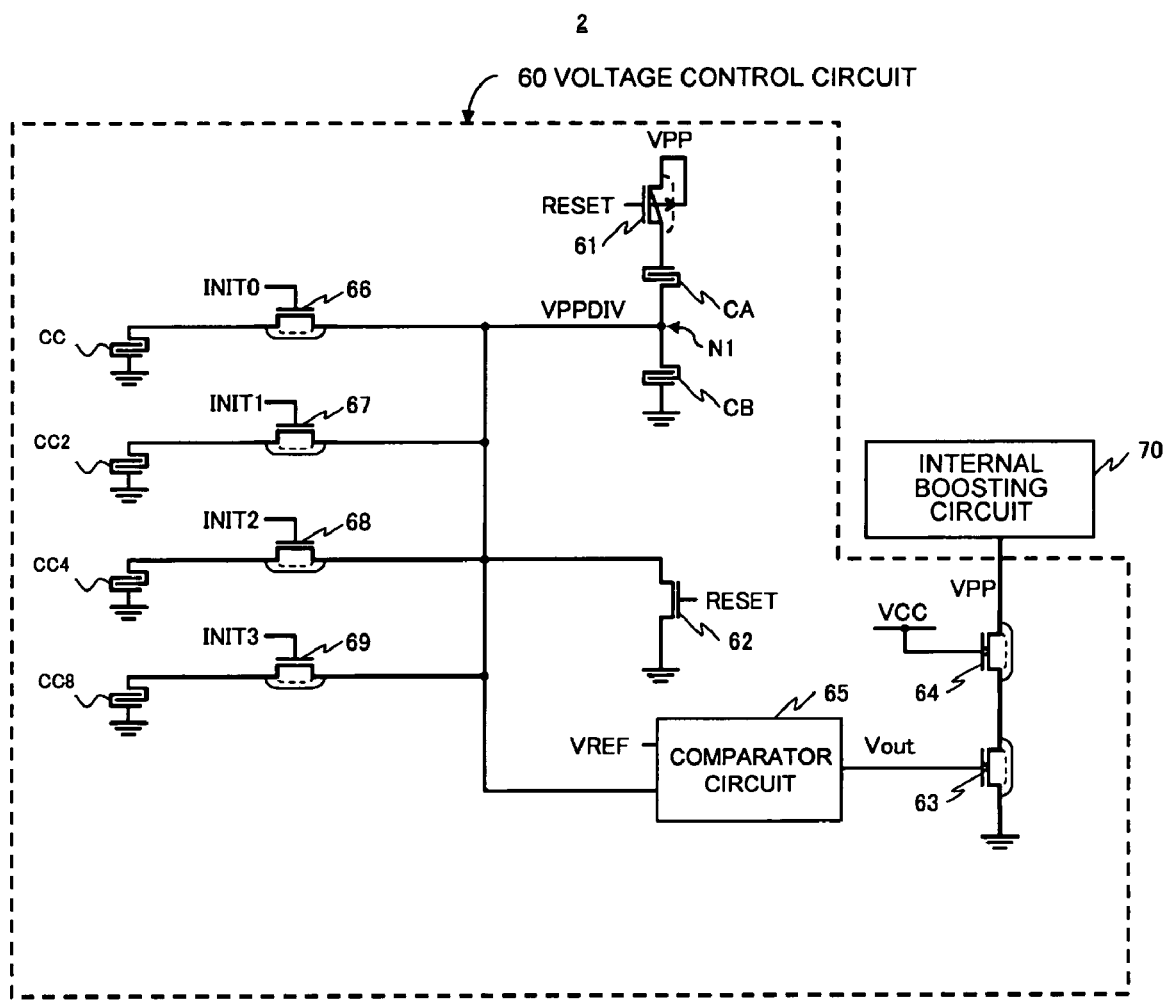
FIG. 7 illustrates the WL high-voltage generating circuit.

Next, the WL high-voltage generating circuit 2 is described. FIG. 7 shows the WL high-voltage generating circuit 2. As shown in FIG. 7, the WL high-voltage generating circuit 2 includes a voltage control circuit 60 and an internal booster circuit 70. The voltage control circuit 60 has transistors controlled, and the transistors form a switch for selecting a predetermined capacity in accordance with signals that define the step widths of program voltages generated by the generating circuits 40 and 50. The voltage control circuit 60 includes a PMOS transistor 61, NMOS transistors 62 through 64, a comparator circuit 65, selecting transistors 66 through 69, capacitors CA and CB, and capacitors CC through CC8. Here, a capacitor CCn (CC4, for example) has a capacity of n×C (4C, for example).

The selecting transistors 66 through 69 are formed with NMOS transistors. The capacitors CC through CC8 are connected to a node N1 via the selecting transistor 66 through 69. A divided voltage VPPDIV is generated by capacity-dividing the booster voltage VPP. This divided voltage VPPDIV is an input to the comparator circuit 65. The comparator circuit 65 compares the divided voltage VPPDIV with a reference voltage VREF, and outputs a signal Vout. If the divided voltage VPPDIV is higher than the reference voltage VREF, the signal Vout becomes High, for example. As the booster voltage is too high, the voltage is controlled to become lower through a discharging operation.

By a step programming method, the decoding signals INIT(3:0) that control the gates of the transistors 66 through 69 are binarily counted, and the booster voltage VPP increases stepwise by the uniform amount.

Figure 8:
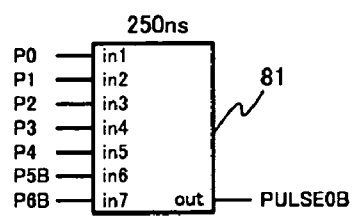
FIG. 8 shows an example of the generating circuit that generates signals that define the pulse widths of program voltages.
Figure 8:
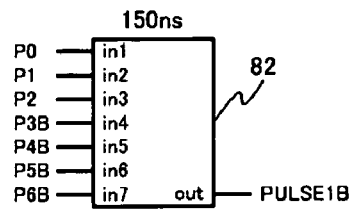
Figure 8:
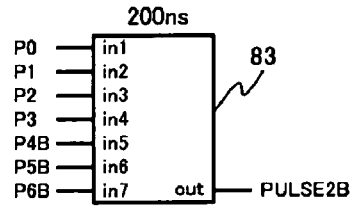
Figure 8:
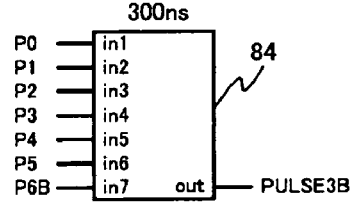
Figure 8:
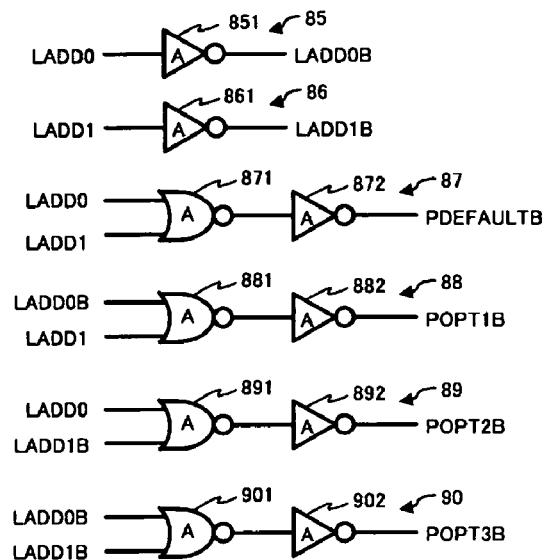
Figure 8:
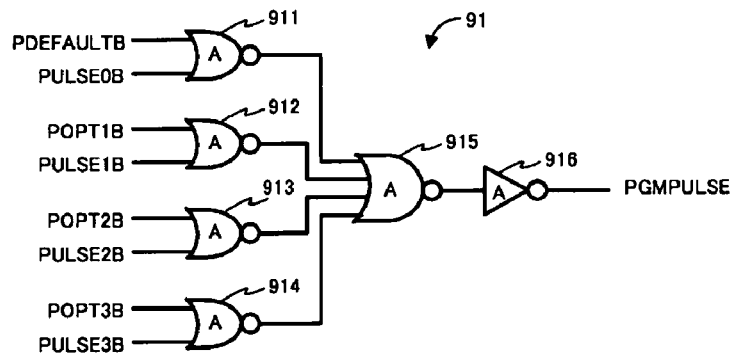

FIG. 8 illustrates an example of a generating circuit 80 that generates signals defining the pulse widths of program voltages. The generating circuit 80 includes circuits 81 through 91. The signal LADD0 and the signal LADD1 are the address latch signals that are latched in the latch circuit 30. These address latch signals serve as trimming signals that adjust program pulse widths. Sub-pulse signals P0 through P6 are generated as pulses with different lengths by a binary counter circuit (not shown) that is driven with an internal clock signal. The circuits 81 through 84 obtain the logics of the sub-pulse signals P0 through P6, so as to generate pulse signals of 150 ns through 300 ns.

More specifically, the circuit 81 generates a pulse signal PULSE0B of 250 ns from signals P0, P1, P2, P3, P4, P5B, and P6B. The circuit 82 generates a pulse signal PULSE1B of 150 ns from signals P0, P1, P2, P3B, P4B, P5B, and P6B. The circuit 83 generates a pulse signal PULSE2B of 200 ns from signals P0, P1, P2, P3, P4B, P5B, and P6B. The circuit 84 generates a pulse signal PULSE3B of 300 ns from signals P0, P1, P2, P3B, P4, P5, and P6B. The circuit 85 includes an inverter 851, and generates the address latch signals LADD0 through LADD0B. The circuit 86 includes an inverter 561, and generates the address latch signals LADD1 through LADD1B.

The circuit 87 includes a NOR circuit 871 and an inverter 872, and generates a signal PDEFAULTB from the signal LADD0 and the signal LADD1. The circuit 88 includes a NOR circuit 881 and an inverter 882, and generates a signal POPT1B from the signal LADD0B and the signal LADD1. The circuit 89 includes a NOR circuit 891 and an inverter 892, and generates a signal POPT2B from the signal LADD0 and the signal LADD1B. The circuit 90 includes a NOR circuit 901 and an inverter 902, and generates a signal POPT3B from the signal LADD0B and the signal LADD1B.

The circuit 91 includes NOR circuits 911 through 915 and an inverter 916, and generates a signal PGMPULSE from the signal PDEFAULTB, the signal PULSE0B, the SIGNAL POPT1B, the signal PULSE2B, a signal POP2B, the signal PULSE3B, the signal POPT3B, and a signal PULSE4B. In this manner, these pulse signals are made enable by the trimming signal, and are supplied as the signal PGMPULSE to the program pulse controller 4. Thus, the pulse width of a program voltage is controlled.

Figure 9:
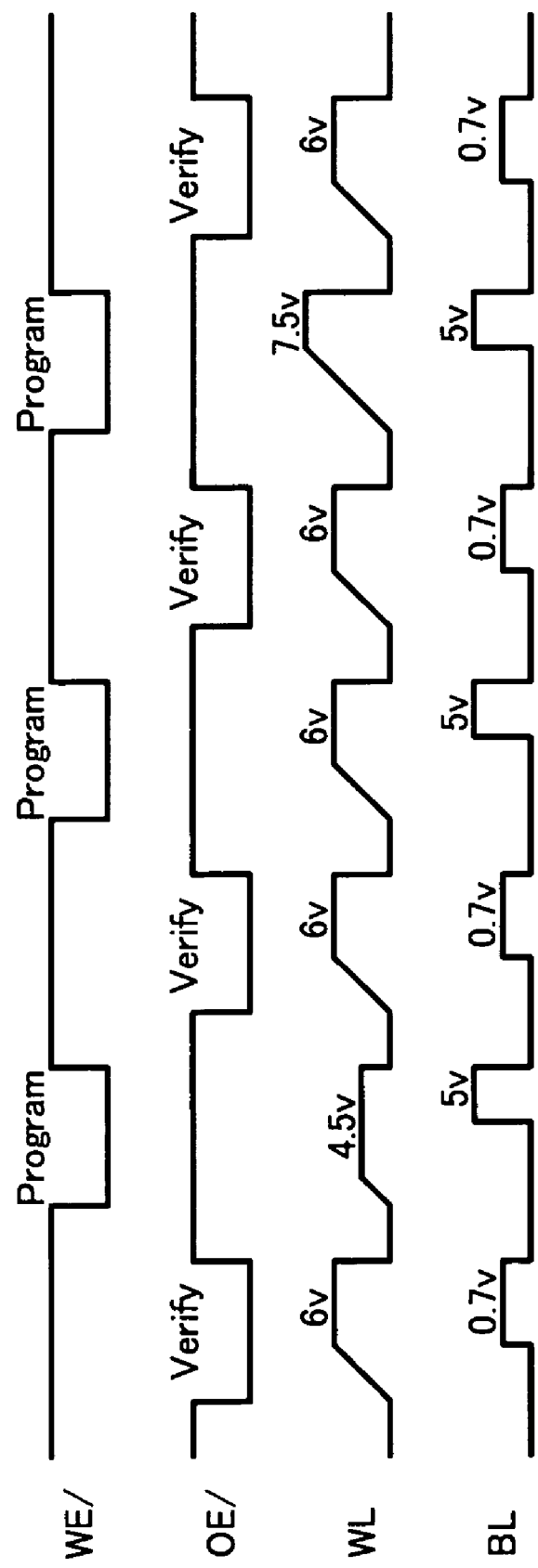
FIG. 9 shows the relationship between the program sequence in accordance with the first embodiment, the word line voltage, and the bit line voltage.

FIG. 9 shows a program sequence in accordance with the first embodiment, and the relationship between the word line voltage WL and the bit line voltage BL. In the test mode, the program period is set with the signal WE/, and the verification period is set with the signal OE/. A verifying operation and a programming operation are alternately repeated. During a verifying operation, the word line voltage WL is a constant voltage of 6v, and the bit line voltage BL is a constant voltage of 0.7v. During a programming operation, the word line voltage WL is ramped by a constant amount, so that it varies from 4.5v to 6v to 7.5v. During a programming operation, the bit line voltage BL is a constant voltage of 5v. Also, the program pulse width B of the bit line BL can be arbitrarily adjusted by the circuit 80 shown in FIG. 8.

As described above, in accordance with the first embodiment, various program voltages are internally generated using address signals that are input from the outside during the test mode. These program voltages are externally judged, so as to determine the optimum conditions for a program voltage. During a normal operation, a programming operation is performed using the optimum program voltage, so that a precise programming operation can be realized. Also, a valid programming operation can be efficiently performed so as not to cause overprogramming in a multilevel flash memory.

Second Embodiment

Next, a second embodiment of the present invention is described. The multi-value memories have four Vt levels of level 1, level 2, level 3, and level 4. Those four levels constitute two sets of output (or input) data. Here, level 1, level 2, level 3, and level 4 are defined as (1, 1), (0, 1), (1, 0), and (0, 0) as two sets of input/output data. When the data of level 4 is programmed, a programming technique by which a memory cell is programmed through each programming to level 2, level 3, and level 4 performed in order is generally used. By this technique, in the cells to be written at level 4, first, the cells are written to level 2 by a first programming flow.

Next, the cells are written to level 3 from level 2 by a second programming flow. Lastly, the cells are written to level 4 from level 3 by a third programming flow, and all the programming operations are ended. For the memory cells in which programming is required only up to level 2 or level 3, actual programming is not performed in the second programming flow or the third programming flow, respectively. A semiconductor memory device utilizing such a programming technique is disclosed in Japanese Unexamined Patent Publication No. 10-241380 (Patent Document 3).

Conventionally, a programming technique of the ramp gate programming method has been known. By the ramp gate programming method, when programming is performed from level 1, which is an erased state, to level 2, an initial voltage is applied to the gate, and programming is performed. If the programming cannot be performed, the gate voltage is increased based on a step voltage, and the next programming is performed. The series of operations is repeated to complete the programming. An example of such a ramp gate program is disclosed in the following document:

K. D. Suh et al., "A 3.3V 32 Mb. NAND Flash Memory with Incremental Step Pulse Programming Scheme", ISSCC Digest of Technical Papers, pp. 128–129, February 1995

In the case of using the ramp gate programming method, however, the program voltage is increased stepwise, so as to prevent overprogramming. In doing so, it is necessary to repeat a programming operation and a program verifying operation. As a result, the program time becomes longer.

The present invention is designed to eliminate the above problems, and provides a semiconductor device and a programming method that can shorten the program time even in a case where programming is performed by the ramp gate programming method.

Figure 10:
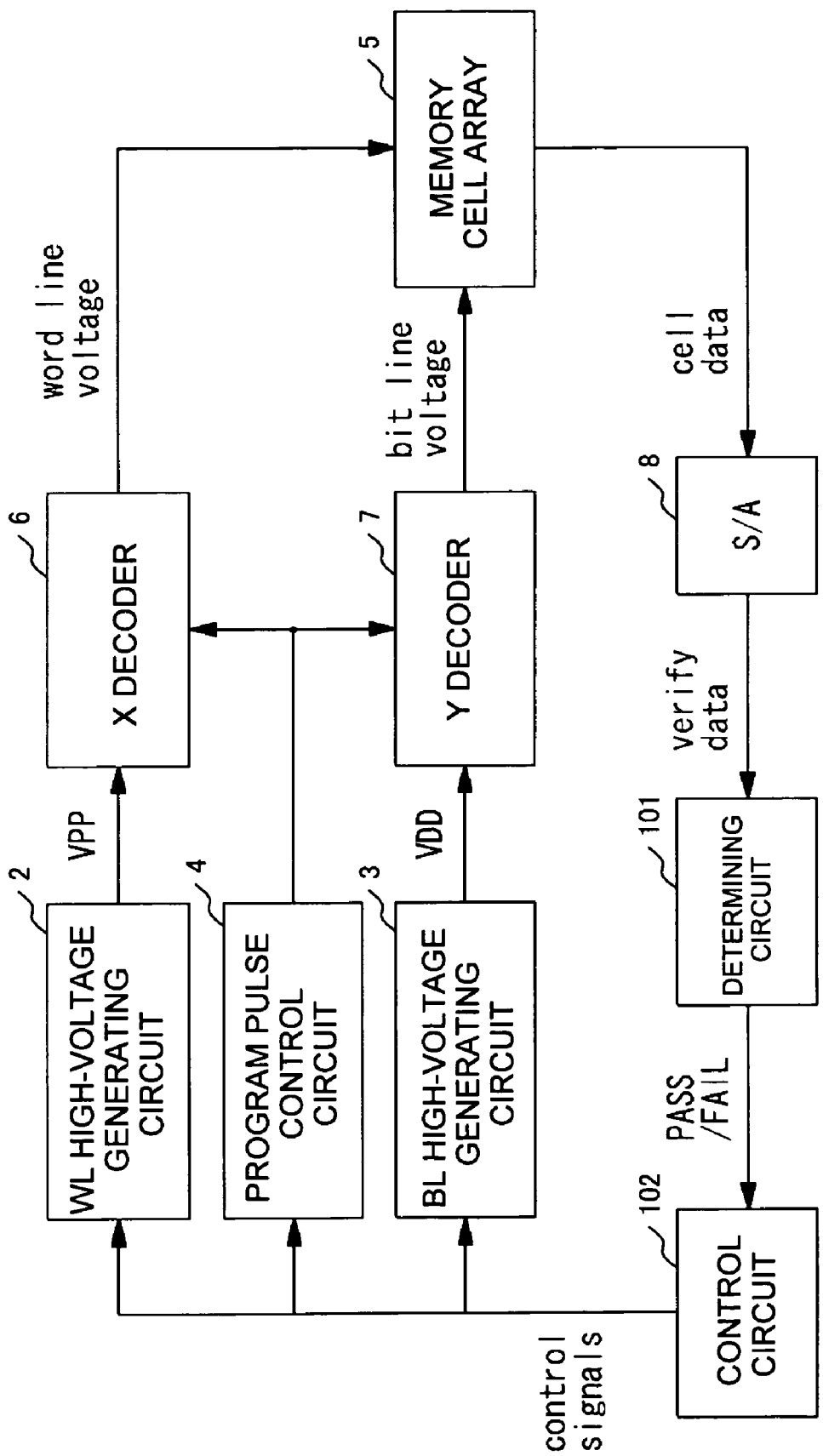
FIG. 10 is a block diagram of a semiconductor device in accordance with a second embodiment.

FIG. 10 is a block diagram of a semiconductor device 100 in accordance with the second embodiment. As shown in FIG. 10, the semiconductor device 100 includes a WL high-voltage generating circuit 2, a BL high-voltage generating circuit 3, a program pulse controller 4, a memory cell array 5, a X decoder 6, a Y decoder 7, a sense amplifier circuit 8, a determining circuit 101, and a control circuit 102. The same components as those in the foregoing embodiment are denoted by the same reference numerals as those of the foregoing embodiment, and explanation of them is omitted herein. The semiconductor device 100 may be a semiconductor memory device such as a flash memory that is independently packaged, or may be incorporated into a semiconductor device such as a system LSI.

The WL high-voltage generating circuit 2 receives a control signal from the control circuit 102, and generates and supplies a booster voltage VPP to the X decoder 6. The X decoder 6 applies a word line voltage to the memory cells of the memory cell array 5. The BL high-voltage generating circuit 3 receives a control signal from the control circuit 102, and generates and supplies a booster voltage VDD to the Y decoder 7. The Y decoder 7 applies a bit line voltage to the memory cells of the memory cell array 5. The program pulse controller 4 receives a control signal from the control circuit 102, and controls the voltage applied to the X decoder 6 and the Y decoder 7. The memory cell array 5 includes a memory cell transistor array, word lines, and bit lines, and stores data in each memory cell transistor. When data is read out, the data from the memory cell designated through an activated word line is read into the corresponding bit line. When programming or erasing is performed, the word line and the bit line are set to a potential suitable for each operation, so that a charge injection into or charge removal from the memory cell is performed.

The control circuit 102 operates as a state machine, based on a logic control signal and a command. The control circuit 102 controls the operation of each component of the semiconductor device 100. To read out data at the address of the memory cell array 5, the control circuit 102 controls the memory cell array 5, the X decoder 6, the Y decoder 7, and the like. Also, to write data at the write address of the memory cell array 5, the control circuit 102 controls the memory cell array 5, the X decoder 6, the Y decoder 7, and the like. Also, to collectively erase data from a designated region of the memory cell array 5 by a predetermined unit, the control circuit 102 controls the memory cell array 5, the X decoder 6, the Y decoder 7, and the like.

A programming operation is performed by the control circuit 102 controlling each circuit. The control circuit 102 includes a generating circuit that generates various control signals that define program voltages that increase stepwise at each level. In a case where data write is to be performed at the last level among several levels, the control circuit 102 performs a programming operation while increasing a program voltage stepwise until the program voltage reaches the maximum voltage value. After the program voltage reaches the maximum voltage value, the control circuit 102 performs a programming operation, using a program voltage with a greater pulse width than the pulse width of any program voltage used at other levels. In the case where data write is to be performed at the last level among several levels, the control circuit 102 performs a programming operation while increasing a program voltage stepwise without a verifying operation, until the program voltage reaches a predetermined voltage value.

The WL high-voltage generating circuit 2, the BL high-voltage generating circuit 3, the X decoder 6, and the Y decoder 7 form a programming circuit that writes data of several levels in memory cells.

The sense amplifier circuit 8 operates under the control of the control circuit 102. The sense amplifier circuit 8 compares the current of cell data that is supplied from the memory cell array 5 in accordance with a designation by the X decoder 6 and the Y decoder 7, with a reference current, thereby determining whether the data is 0 or 1. The determining circuit 101 receives the verification data from the sense amplifier circuit 8, and performs a Pass/Fail determining operation. The determining circuit 101 then sends the determination result to the control circuit 102.

Figure 11:
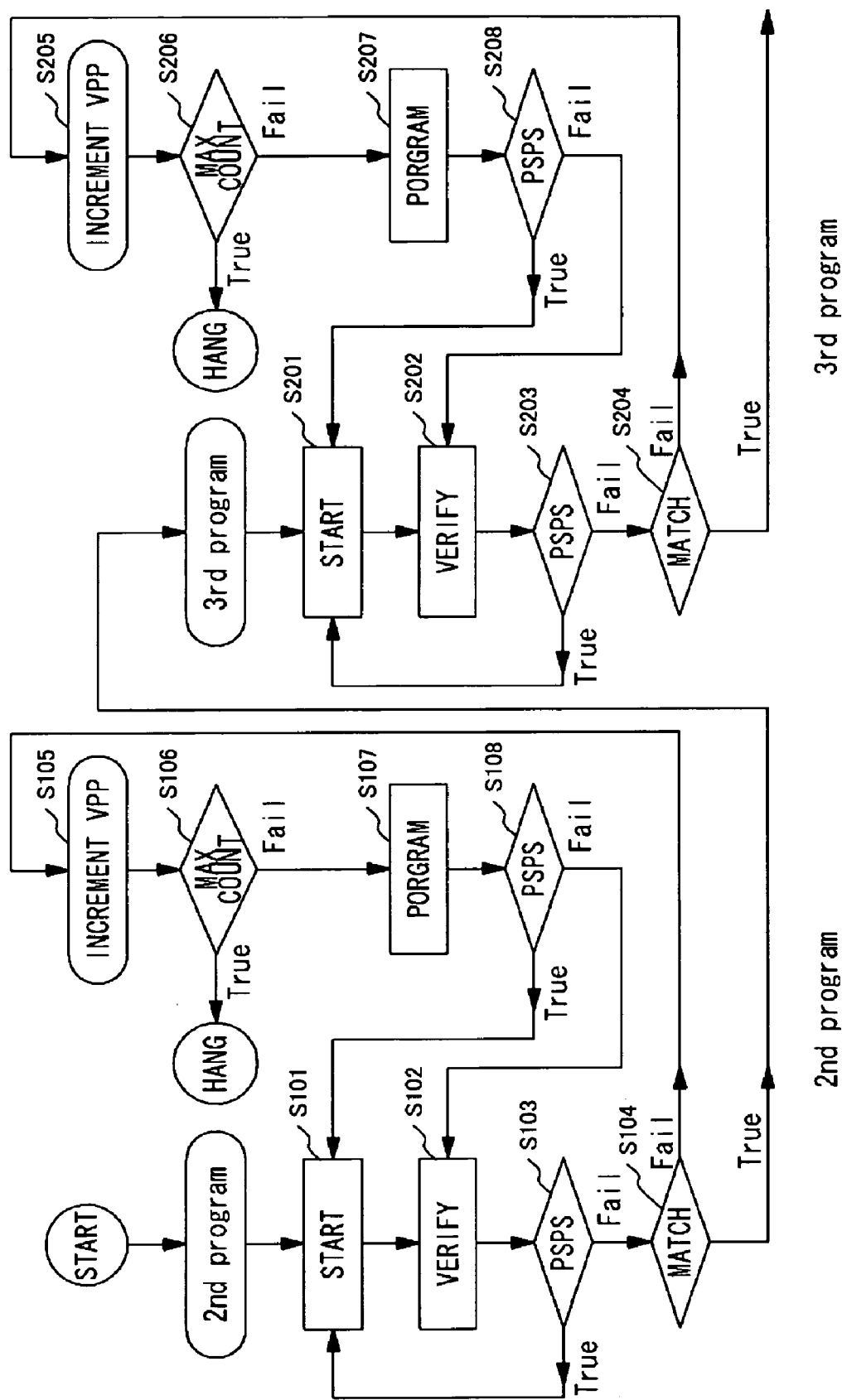
FIG. 11 shows the program flow from level 1 to level 2, and the program flow from level 2 to level 3.
Figure 12:
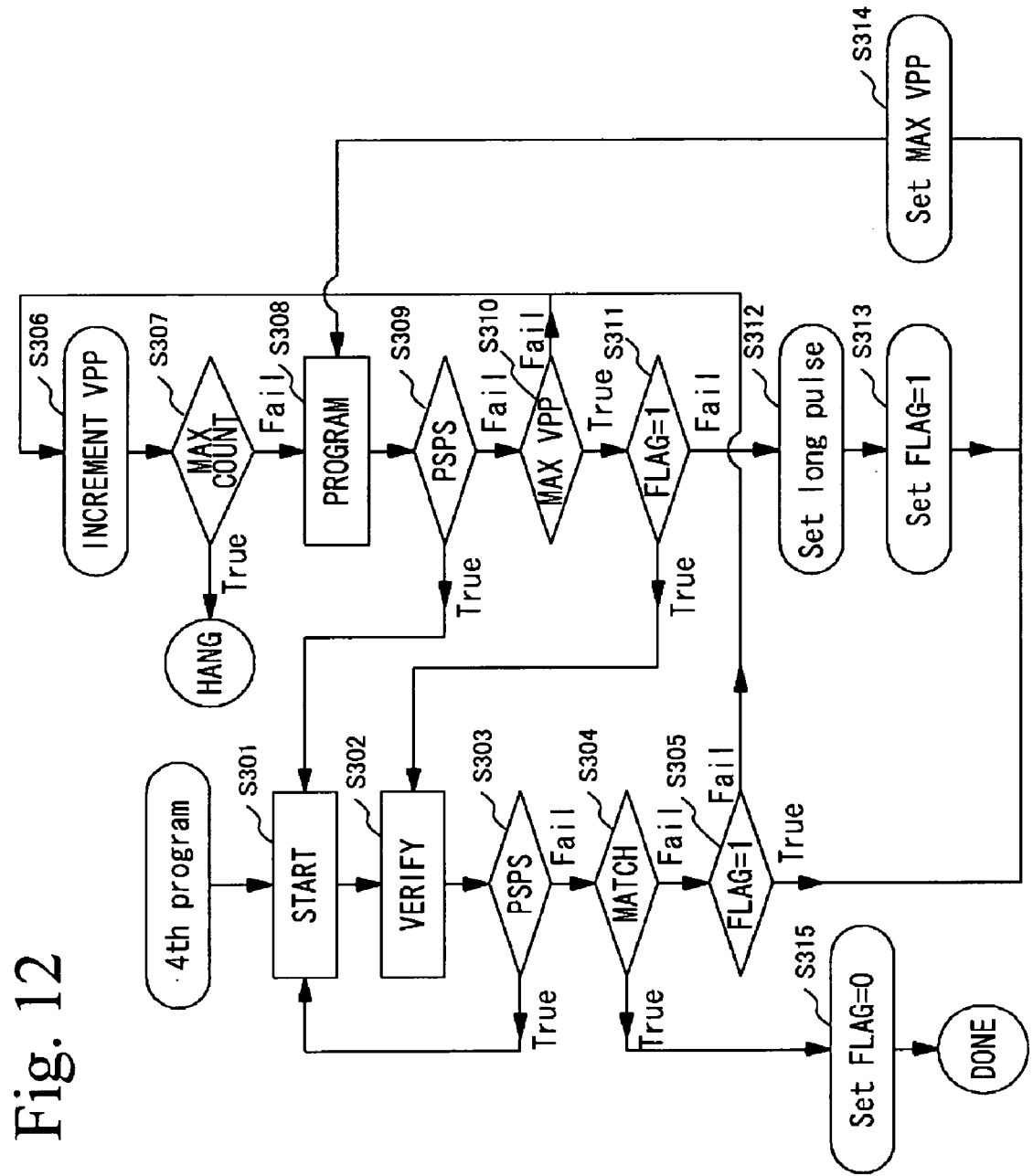
FIG. 12 shows the program flow from level 3 to level 4.

FIGS. 11 and 12 show a multilevel memory cell programming flow that characterizes the present invention. The programming flow from level 1 to level 2 is defined as PGM2ND, the programming flow from level 2 to level 3 is defined as PGM3RD, and the programming flow from level 3 to level 4 is defined as PGM4TH.

FIG. 11 shows the programming flow from level 1 to level 2, and the programming flow from level 2 to level 3. FIG. 12 shows the programming flow from level 3 to level 4.

The programming flows are independent of one another, and each of the flows has unique memory cell programming conditions. The programming conditions are optimized by the control circuit 102, so that the target threshold value Vth can be accurately and quickly written in each flow. In the states of PGM2ND and PGM3RD, the ramp gate programming method by which the gate voltage is gradually increased by applying a programming pulse is employed so as to prevent overprogramming.

In step S101, the control circuit 102 is put into an initial state that is referred to as "START". In step S102, the control circuit 102 performs a program verifying operation. In step S103, the control circuit 102 refers to a program suspend signal PSPS. If the program suspend command is executed in step S103, the control circuit 102 returns to "START", but does not return to "START" immediately after a program command is executed. If the control circuit 102 fails in a matching operation through verification in step S104, the control circuit 102 increases the booster voltage VPP by a small amount (1 step) in step S105, and then moves on to step S106.

In step S106, the control circuit 102 determines whether the number of boosting times of the booster voltage VPP has reached the maximum number of times. If the number of boosting times of the booster voltage VPP is the same as the maximum number of times, the control circuit 102 hangs. If not, the control circuit 102 moves on to step S107, and performs programming on the memory cells. In step S108, if the program suspend signal PSPS is issued and the command is executed, the control circuit 102 returns to step S101, but does not return to "START" immediately after a programming command is executed. If the program suspend signal is not issued in step S108, the control circuit 102 moves on to step S102, and performs a program verifying operation. If the program suspend signal PSPS is not issued in step S103, the control circuit 102 moves on to step S104. If the control circuit 102 again fails in the matching operation through verification in step S104, the above procedures are repeated. If the control circuit 102 passes in the matching operation through verification in step S104, the control circuit 102 moves on to the next flow PGM3RD.

In step S201, the control circuit 102 is put into an initial state that is referred to as "START". In step S202, the control circuit 102 performs a program verifying operation. If the program suspend command is executed in step S203, the control circuit 102 returns to step S201, but does not return to "START" immediately after a program command is executed.

If the control circuit 102 fails in a matching operation through verification in step S204, the control circuit 102 increases the booster voltage VPP by a small amount (1 step) in step S205, and then moves on to step S206. In step S206, the control circuit 102 determines whether the number of boosting times of the booster voltage VPP has reached the maximum number of times. If the number of boosting times of the booster voltage VPP is the same as the maximum number of times, the control circuit 102 hangs. If not, the control circuit 102 moves on to step S207, and performs programming on the memory cells. In step S208, if the program suspend signal PSPS is issued and the command is executed, the control circuit 102 returns to step S201, but does not return to "START" immediately after a programming command is executed.

If the program suspend signal is not issued in step S208, the control circuit 102 moves on to step S202, and performs a program verifying operation. If the program suspend signal PSPS is not issued in step S203, the control circuit 102 moves on to step S204. If the control circuit 102 again fails in the matching operation in step S104, the above procedures are repeated. If the control circuit 102 passes in the matching operation in step S204, the control circuit 102 moves on to the next flow PGM4TH.

In step S301, the control circuit 102 is put into an initial state that is referred to as "START" of PGM4TH. In the state of PGM4TH, a small amount of overprogramming is tolerable, unlike in the state of PGM2ND or PGM3RD. Accordingly, a technique of shortening the programming time is employed. In step S302, the control circuit 102 performs a program verifying operation. If the program suspend command is executed in step S303, the control circuit 102 returns to step S301, but does not return to "START" immediately after a program command is executed. If the control circuit 102 fails in a first matching operation through verification in step S304, the control circuit 102 moves on to step S305. As the flag is 0 (an initial state) in step S305, the control circuit 102 moves on to step S306, and enters the flow according to a ramp gate program.

In step S306, the control circuit 102 increases the booster voltage VPP by a small amount, and then moves on to step S307. In step S307, the control circuit 102 determines whether the number of boosting times of the booster voltage VPP has reached the maximum number of times. If the number of boosting times of the booster voltage VPP is the same as the maximum number of times, the control circuit 102 hangs, as a slow program bit is contained. If the number of boosting times of the booster voltage VPP is not the same as the maximum number of times, the control circuit 102 moves on to step S308, and performs programming on the memory cells. In step S309, if the program suspend signal PSPS is issued and the command is executed, the control circuit 102 returns to step S301, but does not return to "START", immediately after a programming command is executed.

In step S310, the control circuit 102 determines whether the booster voltage VPP is equal to a predetermined maximum voltage. If the booster voltage VPP is determined not to be equal to the maximum voltage in step S310, the control circuit 102 does not enter a verifying flow, but returns to step S306, thereby entering the program flow again. The above loop is repeated. When the booster voltage VPP reaches the maximum voltage in step S310, the control circuit 102 moves on to step S312, as the flag is still 0 in step S311. In step S312, the control circuit 102 enters a long pulse flow.

In step S313, the control circuit 102 sets the flag to "1". In step S314, the control circuit 102 maintains the booster voltage VPP at the maximum voltage value, and performs programming by applying a longer pulse than usual in step S308. After applying the longer pulse, the control circuit 102 enters the verifying flow for the second time, since the flag is 1 in step S311. The control circuit 102 passes in the second-time matching operation through verification in step S304, and then moves on to step S315. In step S315, the flag is set to "0", and all the programming operations are ended. If the control circuit 102 fails in the second-time matching operation through verification in step S304, the control circuit 102 does not enter the flow according to the ramp gate program of step S306, but moves on to step S314. The control circuit 102 then directly enters the long pulse flow.

As described so far, since verification is performed only the minimum number of times (normally twice) in the state of PGM4TH, the programming time can be greatly shortened. In the initial state of PGM4TH, a ramp gate program is executed, as a large amount of memory cell current flows. When the threshold value Vth reaches a certain value, a longer pulse than usual is applied so as to perform programming, while the maximum voltage is maintained. By employing the technique of two-step programming, simultaneous programming in several memory cells can be performed. As a result, the programming time can be shortened.

Figure 13:
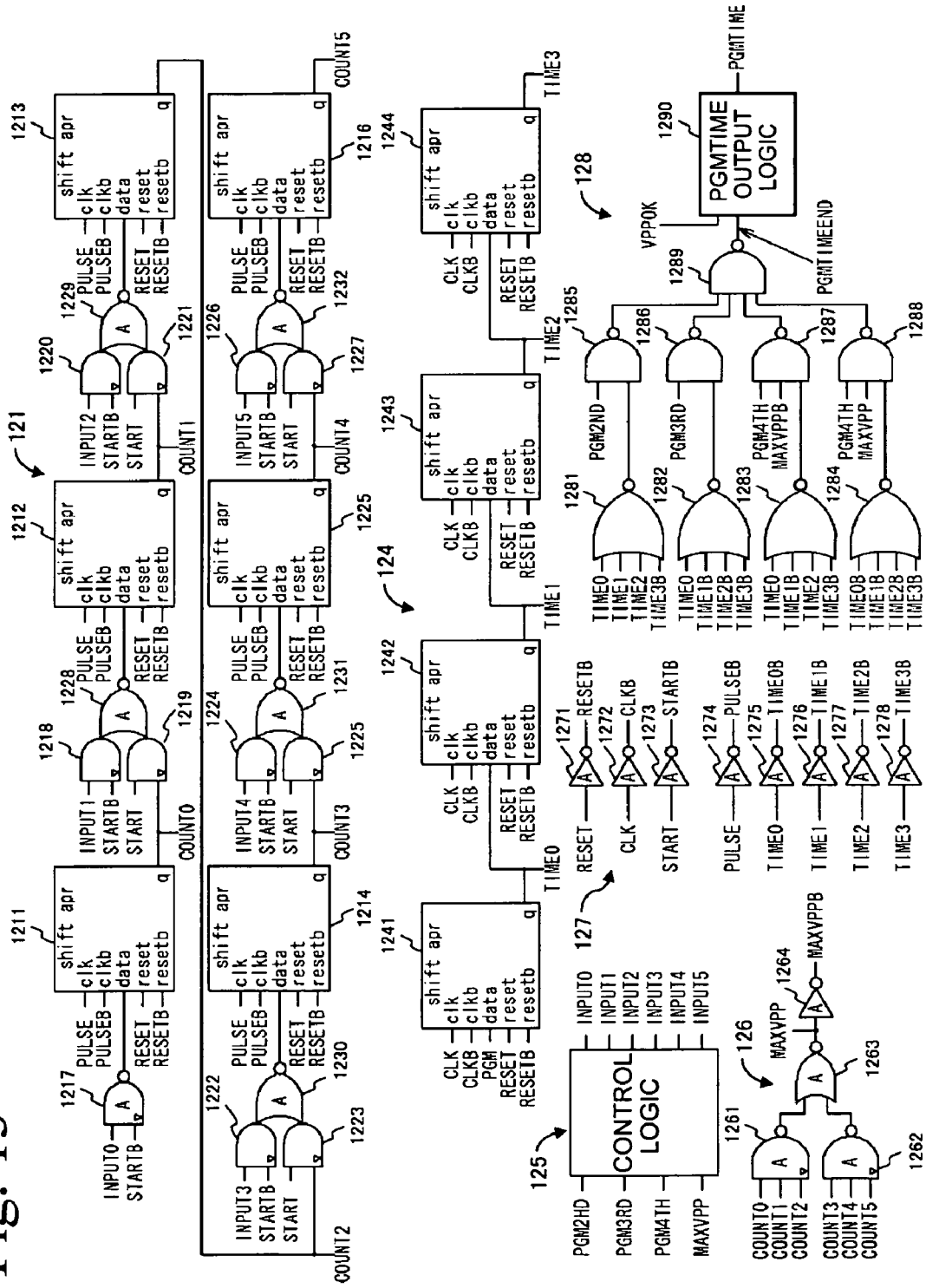
FIG. 13 illustrates the control circuit that controls the programming conditions in each state.

FIG. 13 illustrates the control circuit 102 that controls the programming conditions in each state. The control circuit 102 includes a counter circuit 121, a timer circuit 124, a control logic 125, and circuits 126 through 128. The control logic 125 generates signals INPUT(5:0) at each level, upon receipt of the signal PGM2ND, the signal PGM3RD, the signal PGM4TH, and a signal MAXVPP. The control logic 125 loads the signals INPUT(5:0) as the initial voltage of the gate at the time of programming, into the counter circuit 121.

The counter circuit 121 generates signals that define the initial voltages and step widths of program voltages for each level. The counter circuit 121 includes shift registers 1211 through 1216, NAND circuits 1217 through 1227, and NOR circuits 1228 through 1232. The counter circuit 121 has a counter that is incremented every time a program pulse signal PULSE is applied when a signal START becomes "high" and programming starts. The counter circuit 121 generates signals COUNT(5:0) that are input to the gate of a selecting transistor that selects a capacitor for a voltage control circuit described later. In this manner, the booster voltage VPP to be applied to the gate of the memory cell transistor can be increased stepwise. The signal PULSE is generated in the same timing as the signal PGMTIME. In the state of PGM4TH, the signal MAXVPP to be input to the control logic 125 becomes "high", the counter circuit 121 maintains the signals COUNT(5:0) as they are.

The timer circuit 124 includes shift registers 1241 through 1244, and generates signals TIME(3:0) from a signal CLK, a signal CLKB, a signal PGM, a signal RESET, and a signal RESETB. The timer circuit 124 is reset and starts counting from the beginning every time a pulse is applied. For example, the timer circuit 124 increases the signals TIME (3:0) in cycles of 50 ns every time a pulse is applied. The circuit 126 detects that a program voltage reaches the maximum voltage (a predetermined voltage), and includes NAND circuits 1261 and 1262, a NOR circuit 1263, and an inverter 1264. The circuit 126 generates signals MAXVPP and MAXVPPB from the signals COUNT(5:0).

The circuit 127 includes inverters 1271 through 1278, and generates a signal RESETB, a signal CLKB, a signal STARTB, a signal PULSEB, and signals TIME(3:0)B from the signal RESET, the signal CLK, the signal START, the signal PULSE, and the signals TIME(3:0). The circuit 128 generates signals that define the pulse widths of program voltages through combinations of the signals TIME(3:0) for each level. The circuit 128 includes NOR circuits 1281 through 1284, NAND circuits 1285 through 1289, and a logic 1290.

The circuit 128 generates different signals PGMTIME in the respective states of PGM2ND, PGM3RD, PGM4TH (the signal MAXVPP being LOW), and PGM4TH (the signal MAXVPP being HIGH), from the signals TIME(2:0), the signals TIME(3:0)B, the signal PGM2ND, the signal PGM3RD, the signal PGM4TH, the signal MAXVPP, and the signal MAXVPPB. The signals PGMTIME define the application periods of program pulses. In the state of PGM4TH in which the pulse that is set in each state is observed, a longer pulse than usual is set when the signal MAXVPP becomes "high".

As described above, when programming is to be performed at the last level among several different levels, a signal that defines a program voltage with a longer pulse width than any program voltage used in the other levels. Thus, the programming time can be shortened at the last level.

Figure 14:
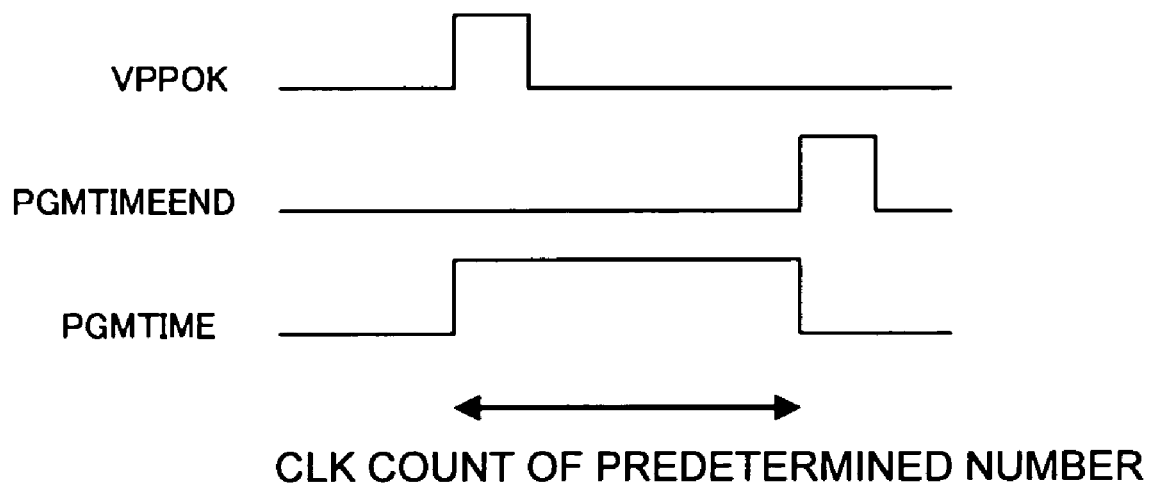
FIG. 14 is a timing chart of the logic.

FIG. 14 is a timing chart of the logic 1290. A signal VPPOK becomes High when the booster voltage VPP reaches a predetermined value. A signal PGMTIME rises when the signal VPPOK becomes High, and falls when the output PGMTIMEEND of the NAND circuit 1289 becomes High. Using the signal VPPOK and the signal PGMTIMEEND, the pulse width of each program voltage can be adjusted at each level.

Figure 15:
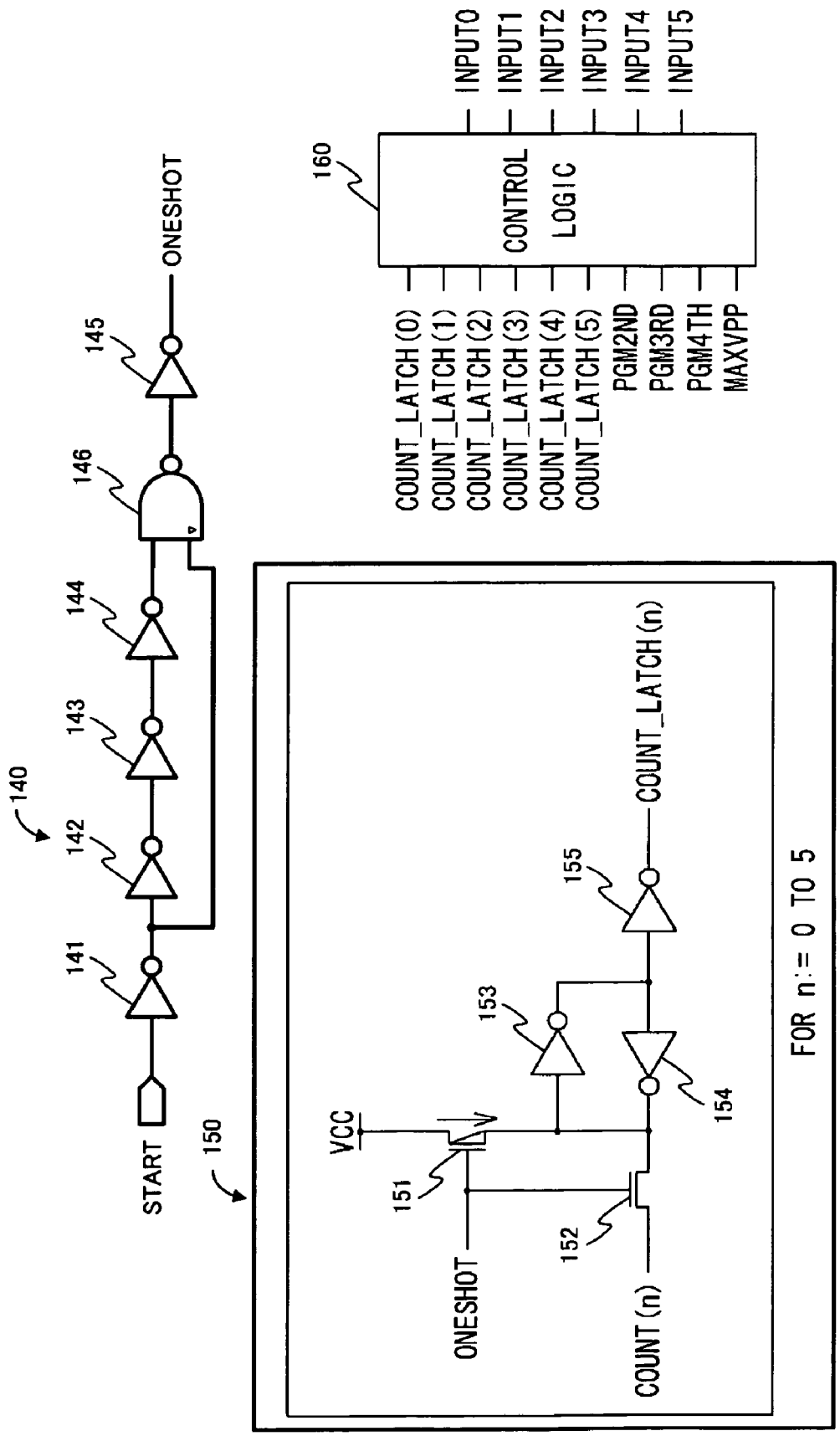
FIG. 15 illustrates the generating circuit of the second embodiment.

FIG. 15 illustrates a generating circuit 130. The generating circuit 130 is provided in the control circuit 102. As shown in FIG. 15, the generating circuit includes circuits 140 and 150, and a control logic 160. The circuit 140 includes inverters 141 through 145, and a NAND circuit 146. The circuit 140 generates a signal ONESHOT from the signal START, and supplies the signal ONESHOT to the latch circuit 150. The latch circuit 150 latches a program voltage when verification passes (i.e., in a predetermined timing) in a case where programming is performed at a certain level among several levels. The latch circuit 150 includes a PMOS transistor 151, a NMOS transistor 152, and inverters 153 through 155. In each program state, the latch circuit 150 sets the booster voltage VPP to a latch that is formed with the inverters 153 and 154 when verification passes. The latch circuit 150 is provided in the same number as the number of signals COUNT. The latch operation is performed by generating a pulse of several nanometers when the next state starts.

The control logic 160 reflects the contents of the latch operation in the initial voltage of the next program state. The control logic 160 receives signals COUNT_LATCH(5:0) that define the initial program voltages corresponding to each program voltage latched in the latch circuit 150, the signal PGM2ND, the signal PGM3RD, the signal PGM4TH, and the signal MAXVPP. The control logic 160 then generates signals INPUT(5:0).

The control logic 160 controls the signals INPUT(5:0) by combining the signals COUNT_LATCH (5:0), PGM2ND, PGM3RD, and PGM4TH. If the program state PGM2ND ends at 5.0v, for example, the control logic 160 sets the initial voltage of PGM3RD at 7.0v. When the program state PGM2ND ends at 6.0v, the control logic 160 sets the initial voltage of PGM3RD at 8.0v. In this manner, the control logic 160 sets an optimum value. The circuit 121 receives the signals INPUT(5:0) from the control logic 160, and generates the signals COUNT(5:0) that define the step width of the program voltage of the next level.

As described above, the generating circuit 130 includes the latch circuit 150 that latches a program voltage when verification passes in a case where programming is performed at a certain level among several different levels, and the control logic 160 that generates the signal that defines the program voltage of the next level that follows the level set previously, based on the initial program voltage corresponding to the program voltage latched in the latch circuit 150. With this structure, the signal that defines the program voltage of the next level is generated, with the program voltage of the previous level being taken into consideration. Thus, a programming operation suitable for the device characteristics can be performed, and the programming time can be shortened.

Figure 16:
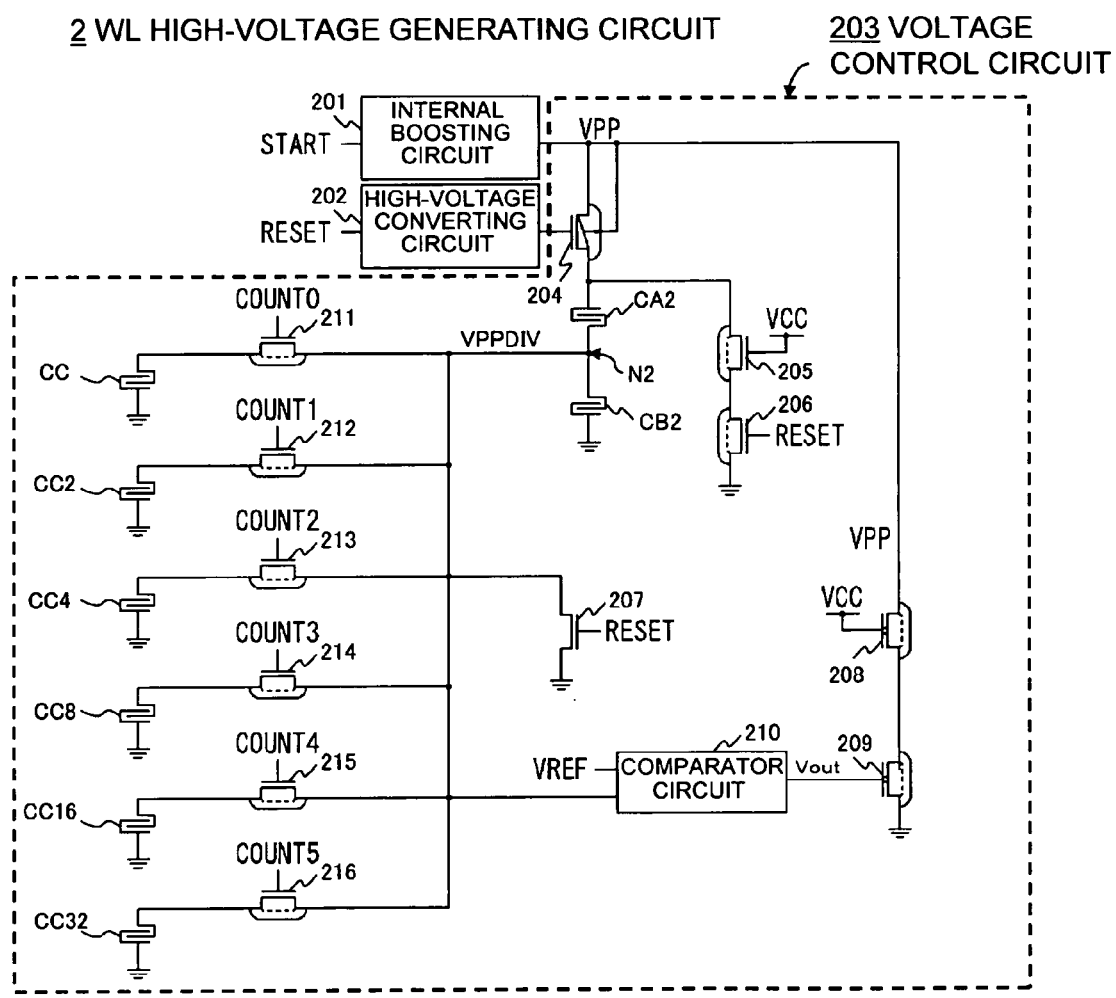
FIG. 16 illustrates the WL high-voltage generating circuit of the second embodiment.

FIG. 16 illustrates the WL high-voltage generating circuit 2 that generates gate voltage. As shown in FIG. 16, the WL high-voltage generating circuit 2 includes an internal boosting circuit 201, a high-voltage converting circuit 202, and a voltage control circuit 203. The voltage control circuit 203 includes a PMOS transistor 204, NMOS transistors 205 through 209, a comparator circuit 210, selecting transistors 211 through 216, capacitors CA2 and CB2, and capacitors CC through CC32. The selecting transistors 211 through 216 are formed with NMOS transistors.

The gates of the selecting transistors 211 through 216 are controlled by the signals COUNT(5:0) that are output from the counter circuit 121 shown in FIG. 13. The capacitors CC through CC32 are connected to a node N2 via the selecting transistors 211 through 216. A divided voltage VPPDIV is generated by capacity-dividing the booster voltage VPP. As the signals COUNT(5:0) are incremented, the capacitors CC through CC32 connected to the node N2 are selected, and the value of the divided voltage VPPDIV is changed. The divided voltage VPPDIV is an input to the comparator circuit 210.

The comparator circuit 210 compares the divided voltage VPPDIV with a reference voltage VREF, and outputs a signal Vout. If the divided voltage VPPDIV is lower than the reference voltage VREF, the signal Vout becomes Low, for example, and the internal boosting circuit 201 increases the booster voltage VPP. In this manner, the signals COUNT(5:0) generated by the counter circuit 121 are supplied to the gates of the selecting transistors 211 through 216, so that the booster voltage VPP to be applied to the gate of the memory cell transistor can be increased and controlled to the predetermined voltage, thereby realizing ramp gate programming. As described above, the initial voltage of the booster voltage VPP and the step voltage used for ramping are optimized by the control circuit 102 in each state.

Figure 17:
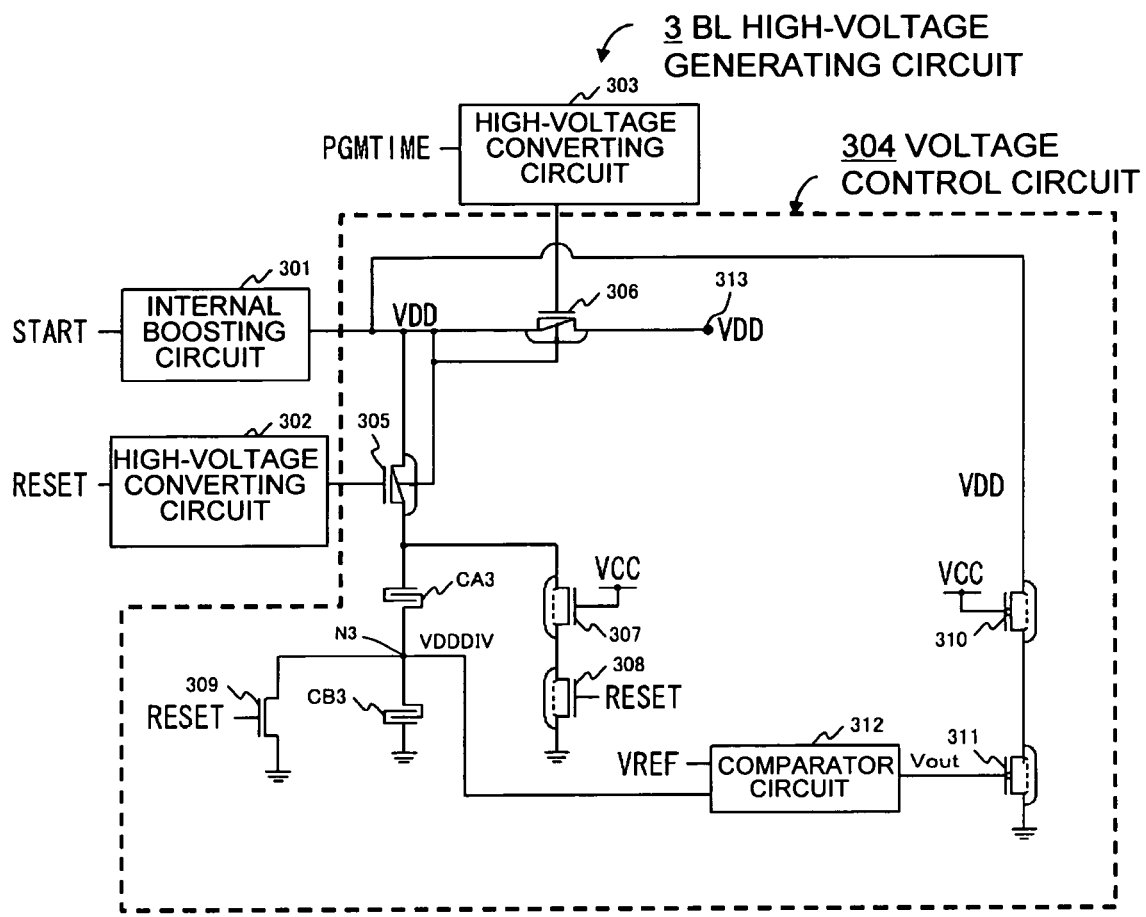
FIG. 17 illustrates the BL high-voltage generating circuit of the second embodiment.

FIG. 17 illustrates the BL high-voltage generating circuit 3 that generates drain voltage. As shown in FIG. 17, the BL high-voltage generating circuit 3 includes an internal boosting circuit 301, high-voltage converting circuits 302 and 303, and a voltage control circuit 304. The voltage control circuit 304 includes PMOS transistors 305 and 306, NMOS transistors 307 through 311, a comparator circuit 312, and capacitors CA3 and CB3. The divided voltage VDDDIV is generated by capacity-dividing the booster voltage VDD. The divided voltage VDDDIV is an input to the comparator circuit 312. The comparator circuit 312 compares the divided voltage VDDDIV with the reference voltage VREF, and outputs the signal Vout.

The programming time is determined by the length of the pulse applied to the drain of the memory cell transistor. Therefore, the high-voltage converting circuit 303 is controlled by the signal PGMTIME generated from the circuit 128 shown in FIG. 13, so as to adjust the booster voltage VDD. After the booster voltage VDD is increased and adjusted to the predetermined voltage, the program drain pulse VDD is applied to the drain of the memory cell transistor via a terminal 313 only during the "high" period of the signal PGMTIME.

Figure 18:
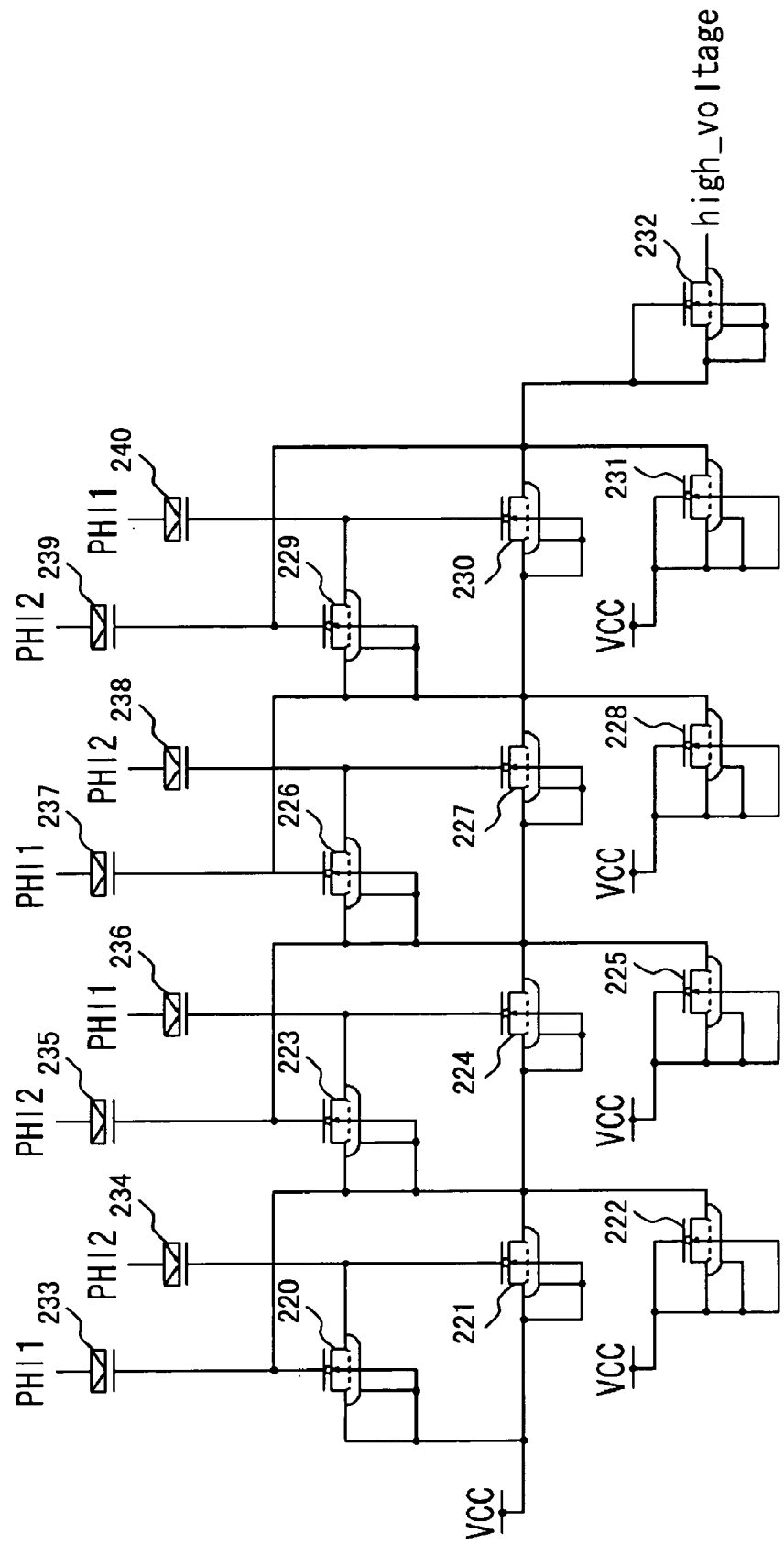
FIG. 18 illustrates the internal boosting circuit used in the second embodiment.

Next, the internal boosting circuit 201 is described. FIG. 18 illustrates the internal boosting circuit 201 that is employed in the second embodiment. As shown in FIG. 18, the internal boosting circuit 201 includes NMOS transistors 220 through 232, and capacitors 232 through 240. A signal PHI1 is a clock signal, and a signal PHI2 is a complementary signal of the signal PHI1. The signal PHI1 and the signal PHI2 are generated inside the semiconductor device 100. The signal PHI1 and the signal PHI2 are alternately input to the electrodes of the capacitors 233 through 240.

Each basic pump cell includes a pair of capacitors 233 and 234, a pair of capacitors 235 and 236, a pair of capacitors 237 and 238, a pair of capacitors 239 and 240, a set of three NMOS transistors 220 through 222, a set of three NMOS transistors 223 through 225, a set of three NMOS transistors 226 through 228, and a set of three NMOS transistors 229 through 231. A boosting operation is repeated from the first-stage basic pump cell until the last-stage basic pump cell. So as to prevent backflow of current, a high voltage "high_voltage" is output via the transistor 232. The internal boosting circuit 301 has the same structure as the above, and therefore, explanation of it is omitted herein.

Figure 19:
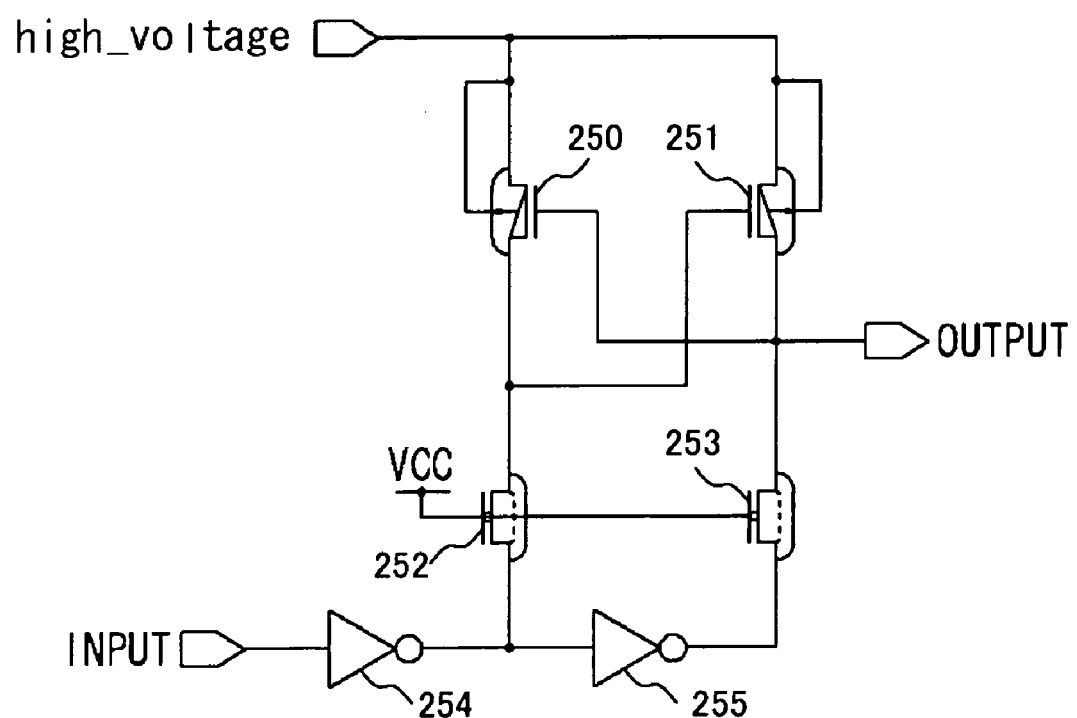
FIG. 19 illustrates the high-voltage converting circuit employed in the structure shown in FIG. 16.

FIG. 19 illustrates the high-voltage converting circuit 202 used in the structure shown in FIG. 16. As shown in FIG. 19, the high-voltage converting circuit 202 includes PMOS transistors 250 and 251, NMOS transistors 252 and 253, and inverters 254 and 255. The gates of the NMOS transistors 252 and 253 are controlled by a supply voltage VCC. When an input INPUT is "high", the PMOS transistor 251 is turned on, and an output OUTPUT becomes "high". When the input INPUT is "low", the PMOS transistor 251 is turned off, the PMOS transistor 250 is turned on, and the output OUTPUT becomes "low". The high-voltage converting circuits 302 and 303 have the same structures as the above, and therefore, explanation of them is omitted herein.

Figure 20:
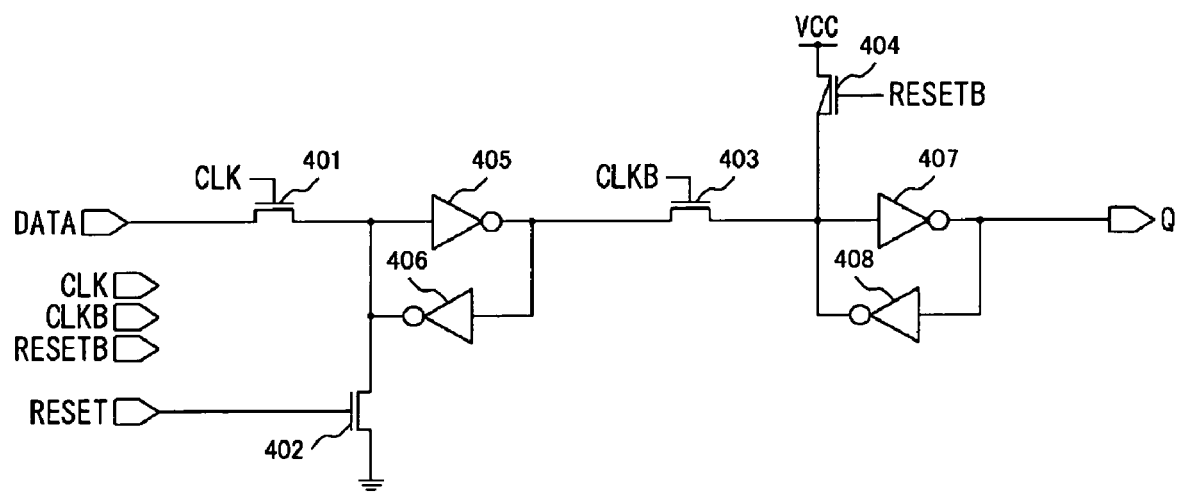
FIG. 20 shows one of the shift registers employed in the structure shown in FIG. 13.

Next, a shift register is described. FIG. 20 illustrates one of the shift registers used in the structure shown in FIG. 13. As shown in FIG. 20, the shift register 1211 includes NMOS transistors 401 through 403, a PMOS transistor 404, and inverters 405 through 408. When the signal CLK is "high", a latch that is formed with the inverters 405 and 406 is set, as a signal DATA is input. When the signal CLKB is "high", a latch that is formed with the inverters 407 and 408 is set.

Figure 21:
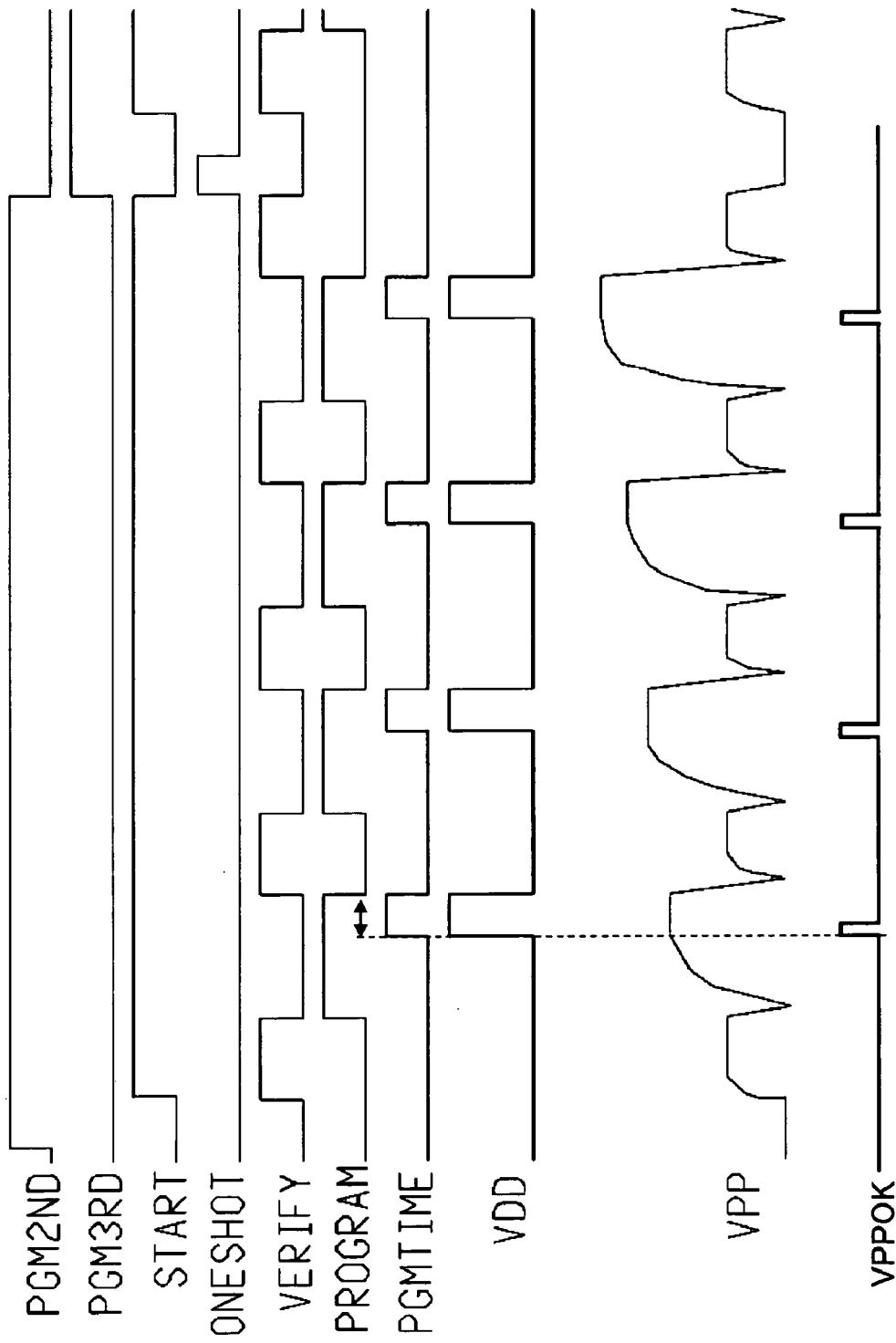
FIG. 21 is a timing chart of PGM2ND in a ramp gate program.

FIG. 21 is a timing chart of the state of PGM2ND in the ramp gate program. In the state of PGM2ND, a program verifying operation and a programming operation are performed a predetermined number of times. The counter circuit 121 reads in the signals INPUT(5:0) from the control logic 125, when the signal START is Low. The counter circuit 121 then sets the initial voltage of each PGM stage. The booster voltage VPP to be applied to the word lines increases from the initial voltage stepwise. The signal VPPOK becomes High when the booster voltage VPP reaches a predetermined value. When the signal VPPOK becomes High, the signal PGMTIME becomes and remains High until the signal PGMTIMEEND becomes High. During the High period of the signal PGMTIME, the booster voltage VDD is applied to the bit lines.

The NOR circuits 1281 through 1284 of the circuit 128 shown in FIG. 13 then detect that the timer circuit 124 shown in FIG. 13 has counted a predetermined number of clocks, and output a High signal. In response to that, the NAND circuit 1285 that has received the signal PGM2ND outputs a Low signal for the first time. Accordingly, the output PGMTIMEEND of the last-stage NAND circuit 1289 becomes High for the first time. The signal PGMTIME then becomes Low, and the drain pulse application is finished.

When the program moves on to the state of PGM3RD and the signal START changes from Low to High, the signal ONESHOT becomes High, and the signals COUNT(5:0) are latched in the inverters 153 and 154 of each latch circuit 150. Thus, the program voltage used when verification passes can be latched, and the control logic 160 can reflect the contents of the latch in the initial voltage of the next program state. In this manner, programming that is suitable for the device characteristics can be realized.

FIG. 22 is a timing chart of the state of PGM4TH in the ramp gate program. Here, a program verifying operation is performed once. If the matching operation through first verification fails, the operation enters the flow of the ramp gate program, and the booster voltage VPP is gradually increased. When the signal START is "low", the counter circuit 121 reads in the signals INPUT(5:0) from the control logic 125, and sets the initial voltage of each PGM stage. The booster voltage VPP to be applied to the word lines increases from the initial voltage stepwise.

While the signal PGMTIME is High, the booster voltage VDD is applied to the bit lines. When the NOR circuits 1281 through 1284 of the circuit 128 shown in FIG. 13 detect that the timer circuit 124 shown in FIG. 13 has counted a predetermined number of clocks, a High signal is output. The NAND circuit 1287, which has received the signal PGM4TH and the signal MAXVPPB, outputs a Low signal. When the output PGMTIMEEND of the last-stage NAND circuit 1289 becomes High, the signal PGMTIME becomes Low, and the drain pulse application is finished.

When the booster voltage VPP reaches the maximum voltage MAXVPP, a programming operation is performed by applying a much longer pulse than usual while the booster voltage VPP is maintained at the maximum value. While the signal PGMTIME is High, the booster voltage VDD is applied to the bit lines. When the NOR circuits 1281 through 1284 of the circuit 128 shown in FIG. 13 detect that the time circuit 124 shown in FIG. 13 has counted a predetermined number of clocks, a High signal is output. The NAND circuit 1288, which has received the signal PGM4TH and the signal MAXVPP, then outputs a Low signal. When the output PGMTIMEEND of the last-stage NAND circuit 1289 becomes High, the signal PGMTIME becomes Low, and the drain pulse application is finished. When verification passes in the second verifying flow, all the programming operations are ended.

As described above, verification is performed only the minimum number of times (normally twice). Accordingly, the programming time can be greatly shortened. Since a large amount of memory cell current flows in the initial state of PGM4TH, a ramp gate program is executed, and programming is performed by applying a much longer pulse than usual while the maximum voltage is maintained, if the threshold value Vth has reached a certain value. By employing the two-stage programming method, simultaneous programming in several memory cells becomes possible, and the programming time is shorted accordingly.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
    a latch circuit that latches a given signal in a test mode; and
    a generating circuit that generates a signal that defines a pulse width of a program voltage used for programming of a memory cell in accordance with the signal latched in the latch circuit.

2. The semiconductor device as claimed in claim 1, wherein the generating circuit generates the signal that defines an initial voltage of the program voltage.

3. The semiconductor device as claimed in claim 1, wherein the generating circuit generates the signal that defines a step width of the program voltage when the program voltage is a voltage that increases stepwise.

4. The semiconductor device as claimed in claim 1, wherein:
    the generating circuit generates the signal that defines a step width of the program voltage when the program voltage is a voltage that increases stepwise; and
    the semiconductor device further comprises a voltage control circuit that controls a switch that selects a capacitor in accordance with the signal that defines the step width of the program voltage.

5. The semiconductor device as claimed in claim 1, wherein the latch circuit is connected to a given address terminal, and the given signal is an address signal applied via the address terminal.

6. The semiconductor device as claimed in claim 1, further comprising a sense amplifier circuit that outputs verification data from cell data read out from the memory cell during a given period for verification in the test mode.

7. The semiconductor device as claimed in claim 1, further comprising a reference circuit that selects a specific reference cell from a plurality of reference cells used for verification in accordance with the given signal latched in the latch circuit.

8. The semiconductor device as claimed in claim 1, wherein the latch circuit latches given signals in accordance with signals provided to the latch circuit.

9. The semiconductor device as claimed in claim 1, further comprising a non-volatile memory that stores the given signal latched in the latch circuit.

10. The semiconductor device as claimed in claim 1, further comprising:
    a non-volatile memory that stores the given signal latched in the latch circuit; and
    a control circuit that generates the signal that defines the program voltage in accordance with the given signal stored in the non-volatile memory.

11. The semiconductor device as claimed in claim 1, wherein the memory cell has multiple threshold values.

12. The semiconductor device as claimed in claim 11, wherein the program voltage increases stepwise for each of multiple threshold values of the memory cell.

13. A method of testing a semiconductor device comprising the steps of:
    latching a given signal in a test mode; and
    generating a signal that defines a step width of a program voltage used for programming of a memory cell in accordance with the given signal latched.

14. The method as claimed in claim 13, wherein the step of generating comprises the step of generating the signal that defines an initial voltage of the program voltage.

15. The method as claimed in claim 13, wherein the step of generating comprises the step of generating the signal that defines a pulse width of the program voltage in accordance with the given signal latched.

16. A semiconductor device comprising:
    a write circuit that writes data having multiple levels into memory cells with multiple threshold values; and
    a generating circuit that generates, for each of the multiple levels, a signal that defines a program voltage that increases stepwise.

17. The semiconductor device as claimed in claim 16, wherein the generating circuit includes a circuit that generates, for each of the multiple levels, the signal that defines a step width of the program voltage.

18. The semiconductor device as claimed in claim 16, wherein the generating circuit includes a circuit that generates, for each of the multiple levels, the signal that defines a pulse width of the program voltage.

19. The semiconductor device as claimed in claim 16, wherein the generating circuit includes a circuit that generates, when programming is involved in a last one of the multiple levels, the signal that defines the program voltage having a pulse width greater than pulse widths of program voltages used for the multiple levels other than the last one.

20. The semiconductor device as claimed in claim 16, further comprising a detection circuit that detects a situation in which the program voltage reaches a given voltage, wherein the generating circuit includes a circuit that generates, when programming is involved in a last one of the multiple levels, the signal that defines the program voltage having a pulse width greater than pulse widths of program voltages used for the multiple levels other than the last one after the detection circuit detects the situation.

21. The semiconductor device as claimed in claim 16, wherein the generating circuit comprises:
    a latch circuit that latches the program voltage at a given timing when programming is involved in a first level among the multiple levels; and
    a circuit that generates another signal that defines a second level following the first level on the basis of an initial program voltage corresponding to the program voltage latched in the latch circuit.

22. The semiconductor device as claimed in claim 21, wherein the given timing is defined as the timing at which verification for programming involved in the first level passes.

23. The semiconductor device as claimed in claim 16, wherein the generating circuit is a control circuit that controls the write circuit.

24. A semiconductor device comprising:
    a write circuit that writes data having multiple levels into a memory cell with multiple threshold values; and
    a control circuit that controls the write circuit and performs programming involved in a last one of the multiple levels with a program voltage having a pulse width greater than pulse widths used in programming involved in the multiple levels other than the last one.

25. A semiconductor device comprising:
    a write circuit that writes data having multiple levels into memory cells with multiple threshold values; and a control circuit that controls the write circuit and performs programming so that a program voltage increases stepwise without verification until the program voltage reaches a given voltage when the programming is involved in a last one of the multiple levels.

26. The semiconductor device as claimed in claim 25, further comprising a detection circuit that detects a situation in which the program voltage reaches a given voltage,
wherein the control circuit performs programming so that the program voltage increases stepwise until the program voltage reaches the given voltage and performs programming involved in the last one of the multiple levels so that a program voltage is provided having a pulse width greater than pulse widths used in programming involved in the multiple levels other than the last one.

27. A semiconductor device comprising:
a write circuit that writes data having multiple levels into memory cells with multiple threshold values; and
a control circuit that controls the write circuit and performs programming involved in a first level out of the multiple levels so that a program voltage increases stepwise while storing the program voltage at a given timing, and performs programming involved in a second level out of the multiple levels so that an initial voltage corresponding to the program voltage stored increases stepwise.

28. The semiconductor device as claimed in claim 27, further comprising a latch circuit that latches the program voltage at the given timing.

29. The semiconductor device as claimed in claim 27, wherein the given timing is defined as the timing at which verification for programming involved in the first level passes.

30. The semiconductor device as claimed in claim 27, wherein the semiconductor device is a semiconductor memory device.

31. A programming method comprising the steps of:
performing programming involved in a first one of multiple levels of data that is written into a memory cell with multiple threshold values while increasing a program voltage stepwise;
storing the program voltage at a given timing in the step of performing; and
performing programming involved in a second one of the multiple levels following the first one while increasing, stepwise, an initial program voltage corresponding to the program voltage stored in the step of storing.

32. A programming method comprising the steps of:
performing programming involved in multiple levels except a last level while increasing a program voltage stepwise; and
performing programming involved in the last level by using the program voltage having a pulse width greater than pulse widths of the program voltages used in programming involved in the multiple levels except the last level.

33. A programming method comprising the steps of:
performing programming involved in multiple levels except a last level while increasing a program voltage stepwise; and
performing programming involved in the last level while increasing the program voltage stepwise without verification for said programming until the program voltage reaches a given voltage.

* * * * *